(12) United States Patent
Bushnell et al.

(10) Patent No.: US 8,164,345 B2
(45) Date of Patent: Apr. 24, 2012

(54) SPECTRAL AND INFORMATION THEORETIC METHOD OF TEST POINT, PARTIAL-SCAN, AND FULL-SCAN FLIP-FLOP INSERTION TO IMPROVE INTEGRATED CIRCUIT TESTABILITY

(75) Inventors: Michael L. Bushnell, Princeton Junction, NJ (US); Raghuveer Ausoori, Highland Park, NJ (US); Omar Khan, San Diego, CA (US); Deepak Mehta, Martinsville, NJ (US); Xinghao Chen, Endwell, NY (US)

(73) Assignee: Rutgers, The State University of New Jersey, New Brunswick, NJ (US)

( * ) Notice: Subject to any disclaimer, the term of this patent is extended or adjusted under 35 U.S.C. 154(b) by 416 days.

(21) Appl. No.: 12/454,476

(22) Filed: May 18, 2009

(65) Prior Publication Data

US 2010/0102825 A1    Apr. 29, 2010

Related U.S. Application Data

(60) Provisional application No. 61/054,046, filed on May 16, 2008, provisional application No. 61/109,245, filed on Oct. 29, 2008.

(51) Int. Cl.
*G01R 31/02* (2006.01)
*G01R 31/28* (2006.01)
*G06F 17/50* (2006.01)

(52) U.S. Cl. ........ 324/537; 714/724; 714/726; 716/111; 716/113

(58) Field of Classification Search .................. None
See application file for complete search history.

(56) References Cited

U.S. PATENT DOCUMENTS

| | | | | |
|---|---|---|---|---|
| 5,450,414 | A  * | 9/1995 | Lin ......................... | 324/750.3 |
| 6,782,515 | B2 * | 8/2004 | Scott et al. ................ | 716/111 |
| 6,970,815 | B1 * | 11/2005 | Bombal et al. ............. | 714/726 |
| 7,036,060 | B2 * | 4/2006 | Nakao et al. ............... | 714/726 |
| 7,131,081 | B2 * | 10/2006 | Wang et al. ................ | 716/136 |
| 7,526,696 | B2 * | 4/2009 | Xiang et al. ............... | 714/726 |
| 8,056,036 | B2 * | 11/2011 | Maeda et al. .............. | 716/113 |
| 2003/0154432 | A1 * | 8/2003 | Scott et al. ................ | 714/724 |
| 2003/0200492 | A1 * | 10/2003 | Nakao et al. ............... | 714/724 |
| 2004/0177299 | A1 * | 9/2004 | Wang et al. ................ | 714/726 |
| 2008/0195904 | A1 * | 8/2008 | Wang ......................... | 714/726 |
| 2008/0295050 | A1 * | 11/2008 | Maeda et al. .............. | 716/6 |
| 2011/0078523 | A1 * | 3/2011 | Kanomata .................. | 714/726 |

* cited by examiner

*Primary Examiner* — Jermele M Hollington
(74) *Attorney, Agent, or Firm* — Davidson, Davidson & Kappel, LLC

(57) ABSTRACT

Design for testability (DFT) algorithms, which use both gradient descent and linear programming (LP) algorithms to insert test points (TPs) and/or scanned flip-flops (SFFs) into large circuits to make them testable are described. Scanning of either all flip-flops or a subset of flip-flops is supported. The algorithms measure testability using probabilities computed from logic simulation, Shannon's entropy measure (from information theory), and spectral analysis of the circuit in the frequency domain. The DFT hardware inserter methods uses toggling rates of the flip-flops (analyzed using digital signal processing (DSP) methods) and Shannon entropy measures of flip-flops to select flip-flops for scan. The optimal insertion of the DFT hardware reduces the amount of DFT hardware, since the gradient descent and linear program optimizations trade off inserting a TP versus inserting an SFF. The linear programs find the optimal solution to the optimization, and the entropy measures are used to maximize information flow through the circuit-under-test (CUT). The methods limit the amount of additional circuit hardware for test points and scan flip-flops.

8 Claims, 13 Drawing Sheets

Spectral analysis procedure used for test point selection.

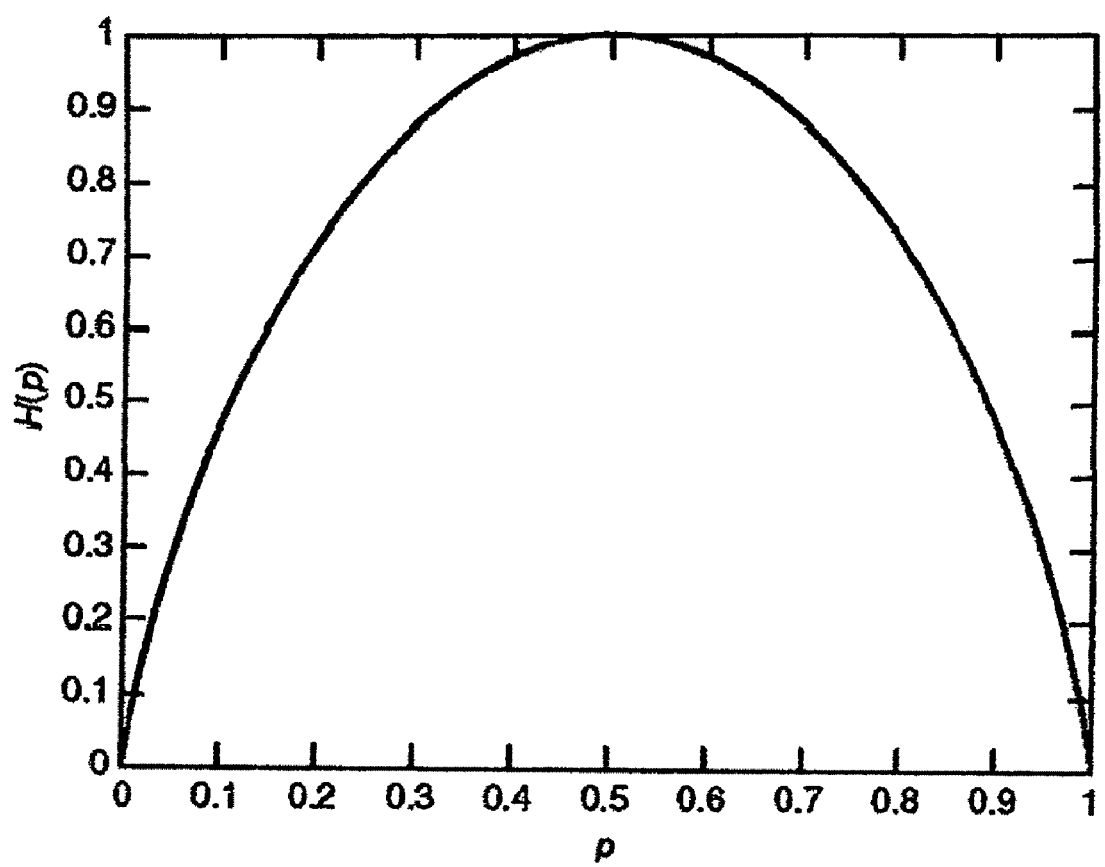
Figure 1: $H(p)$ vs $p$.

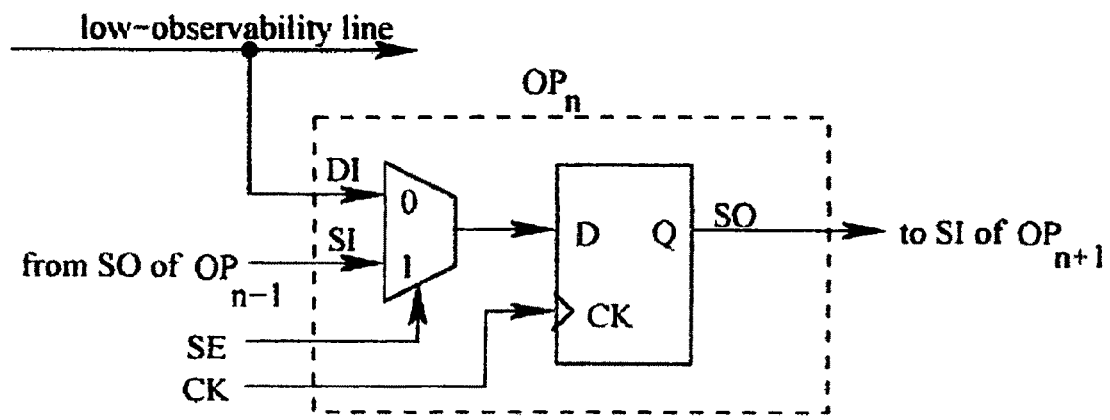
Figure 2: An observation point.
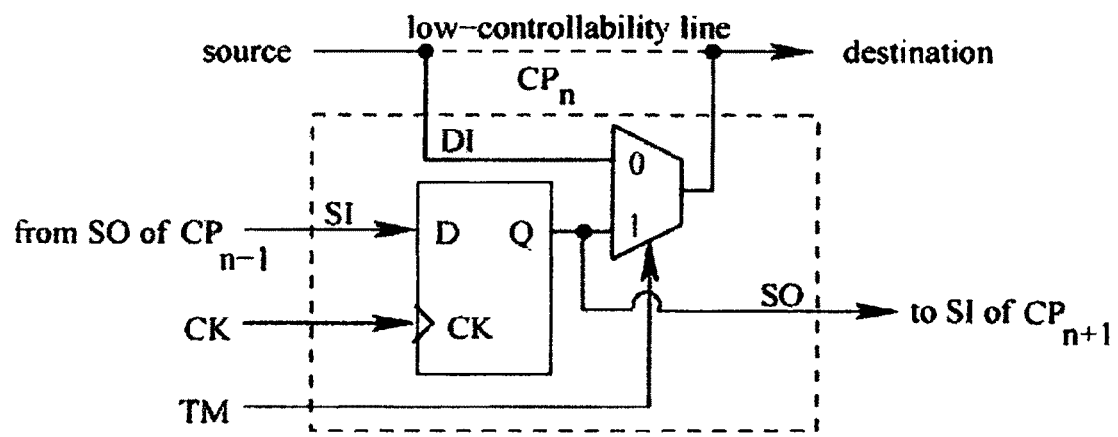
Figure 3: A control point.

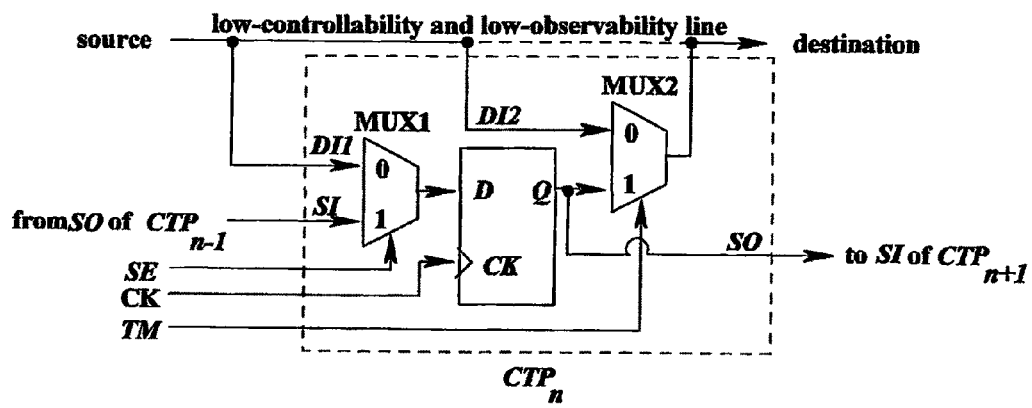
Figure 4: Complete test point.
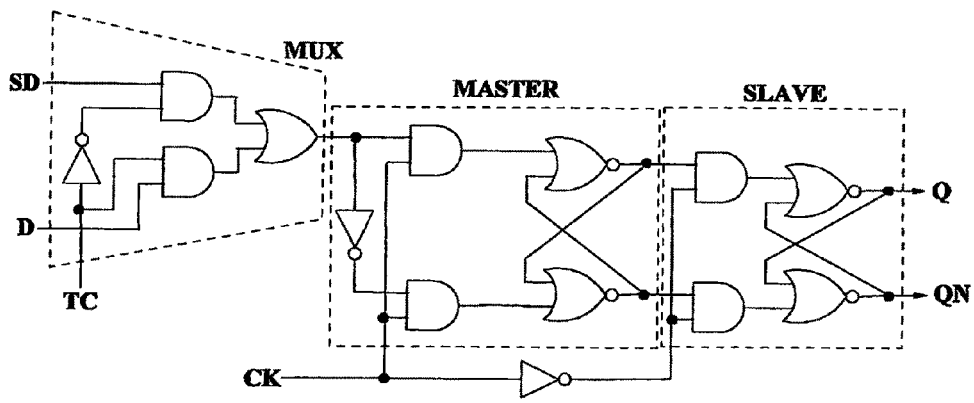
Figure 5: A single-clock *scan flip-flop* (SFF).

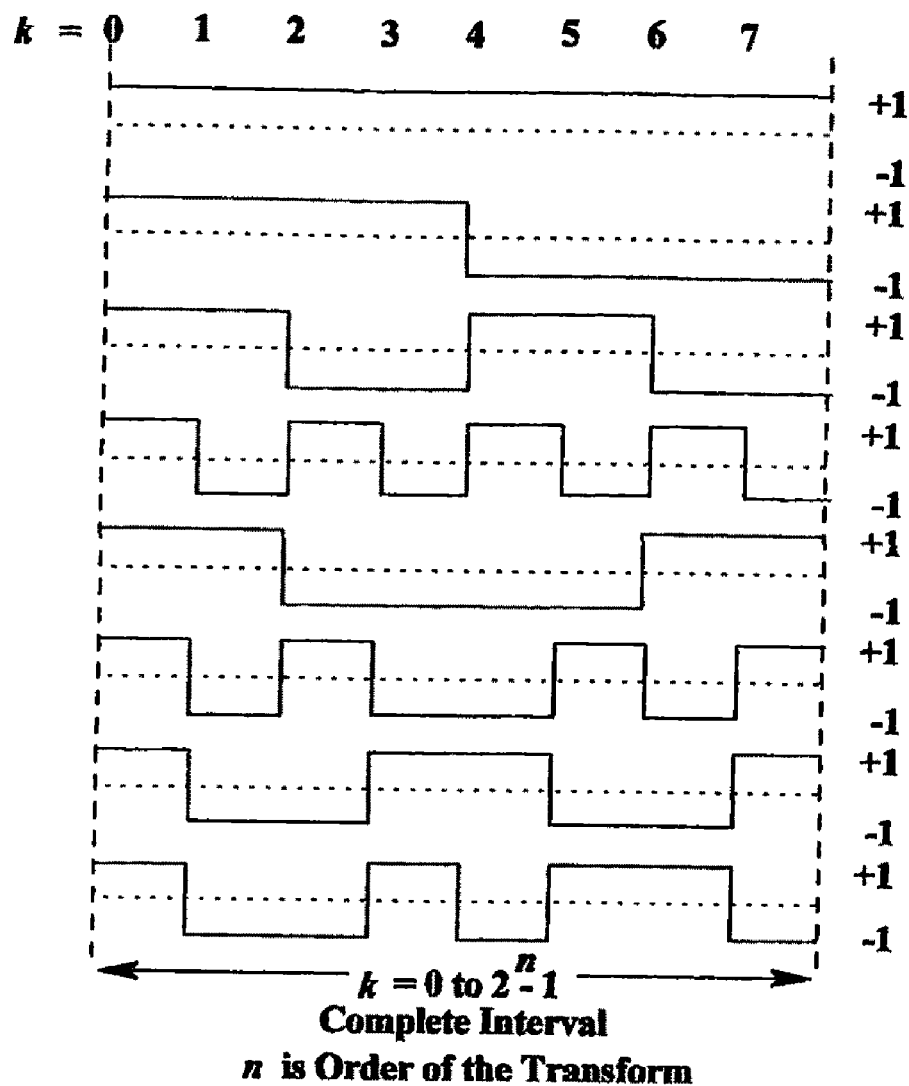
Figure 6: Orthogonal Radamacher-Walsh functions for $n = 3$.

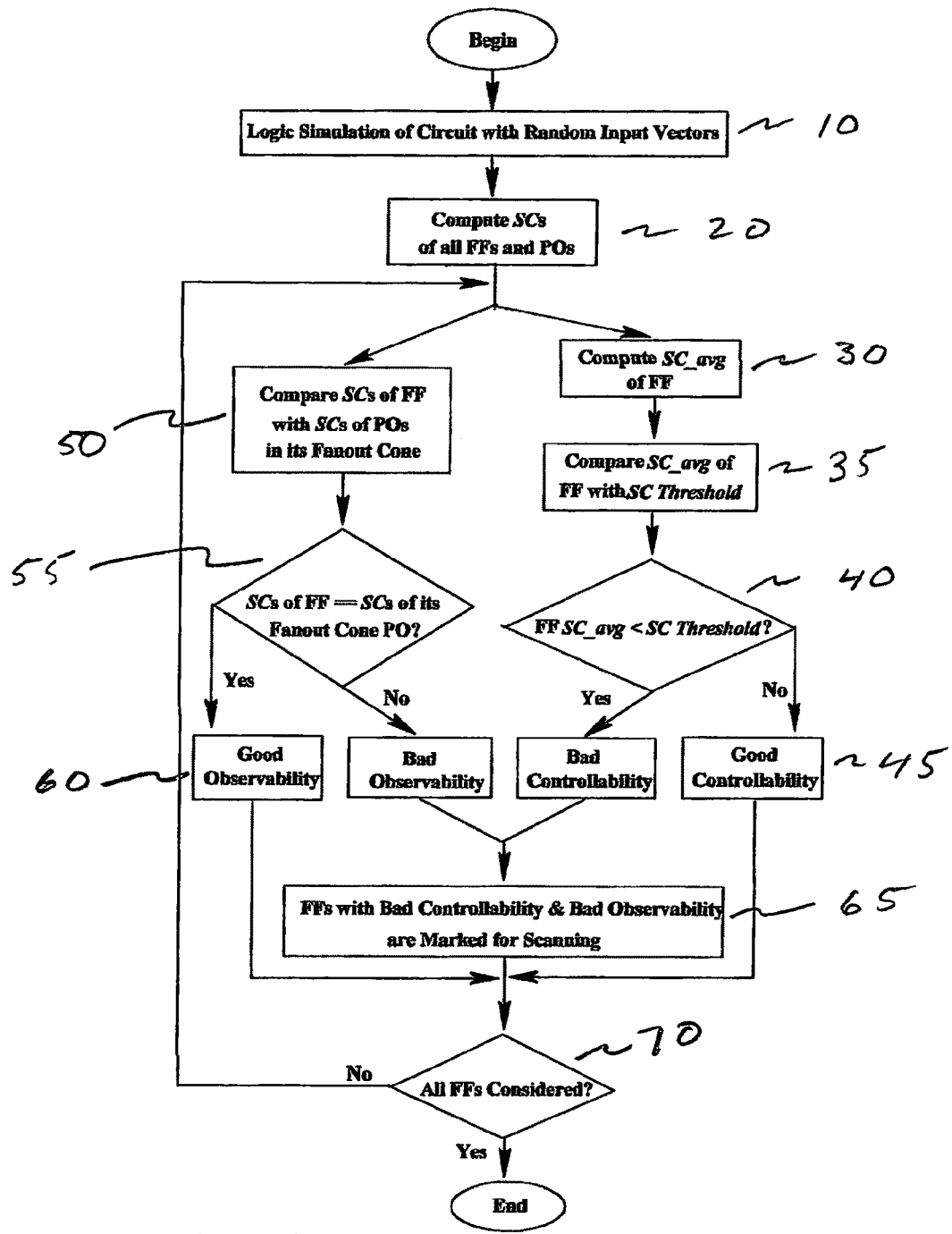
Figure 7: SPARTAN's spectral SFF selection procedure.

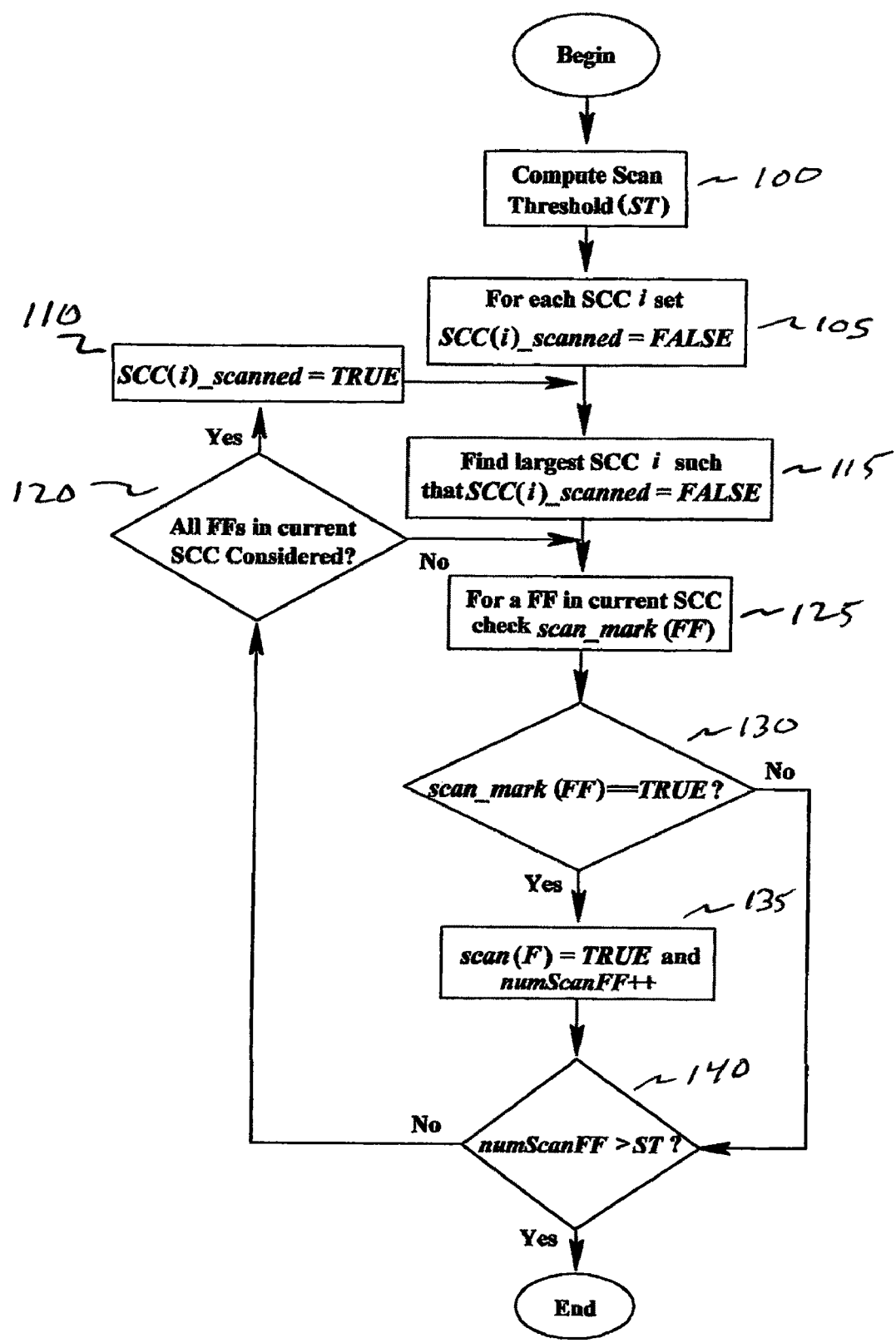
Figure 8: Procedure 1a — SPARTAN's spectral SFF selection.

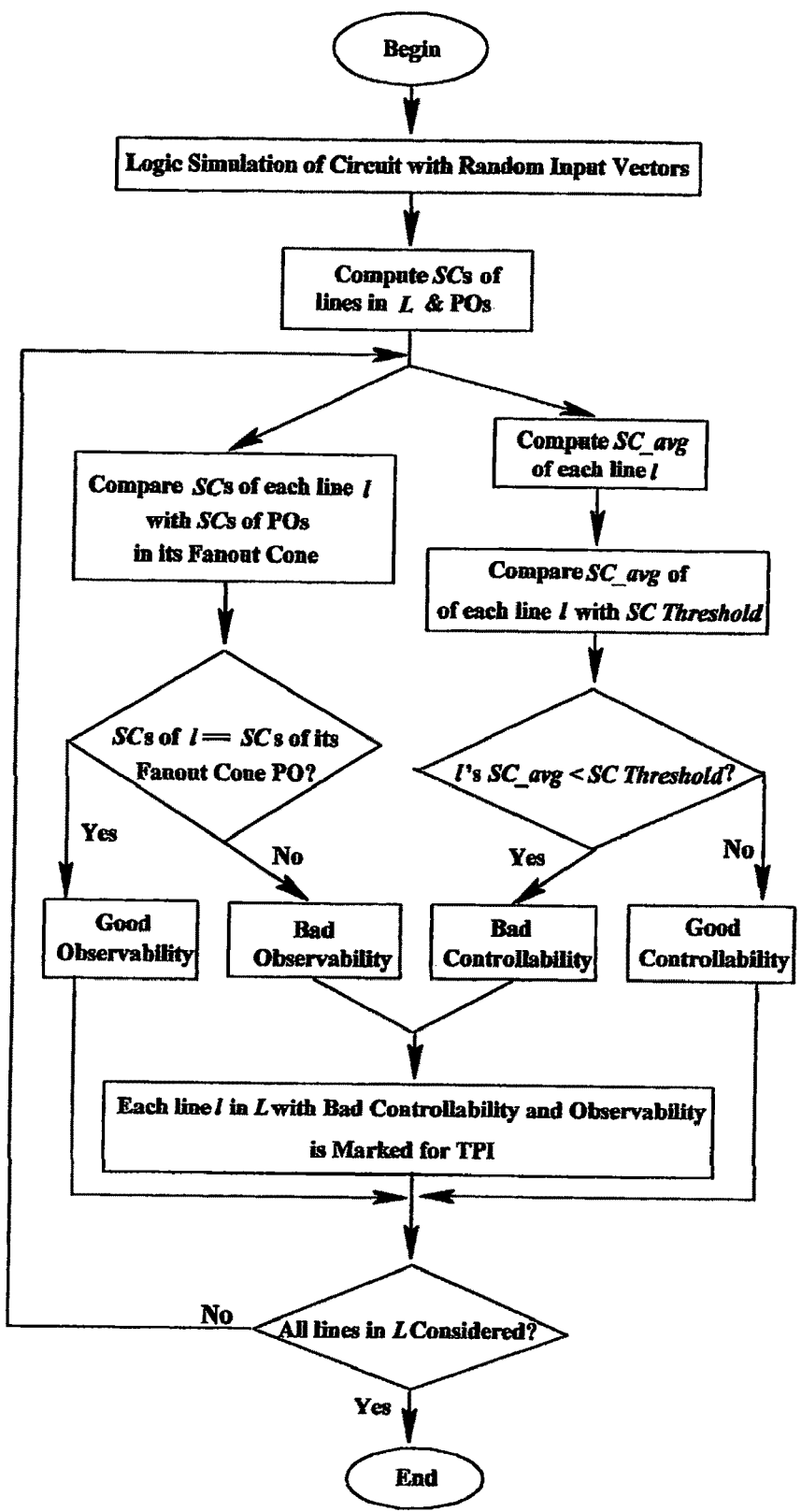
Figure 9: Spectral analysis procedure used for test point selection.

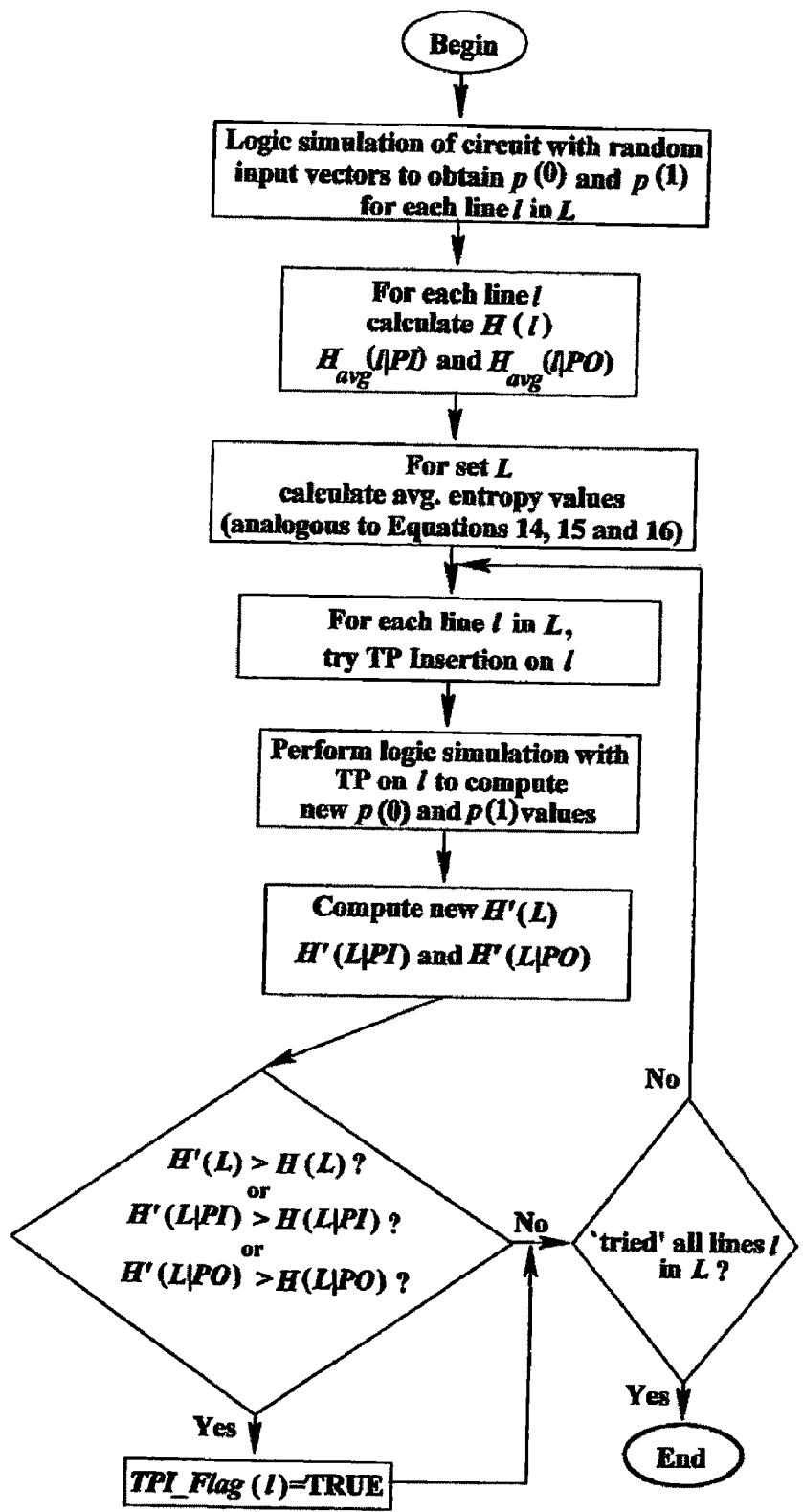
Figure 10: Entropy analysis procedure used for test point selection.

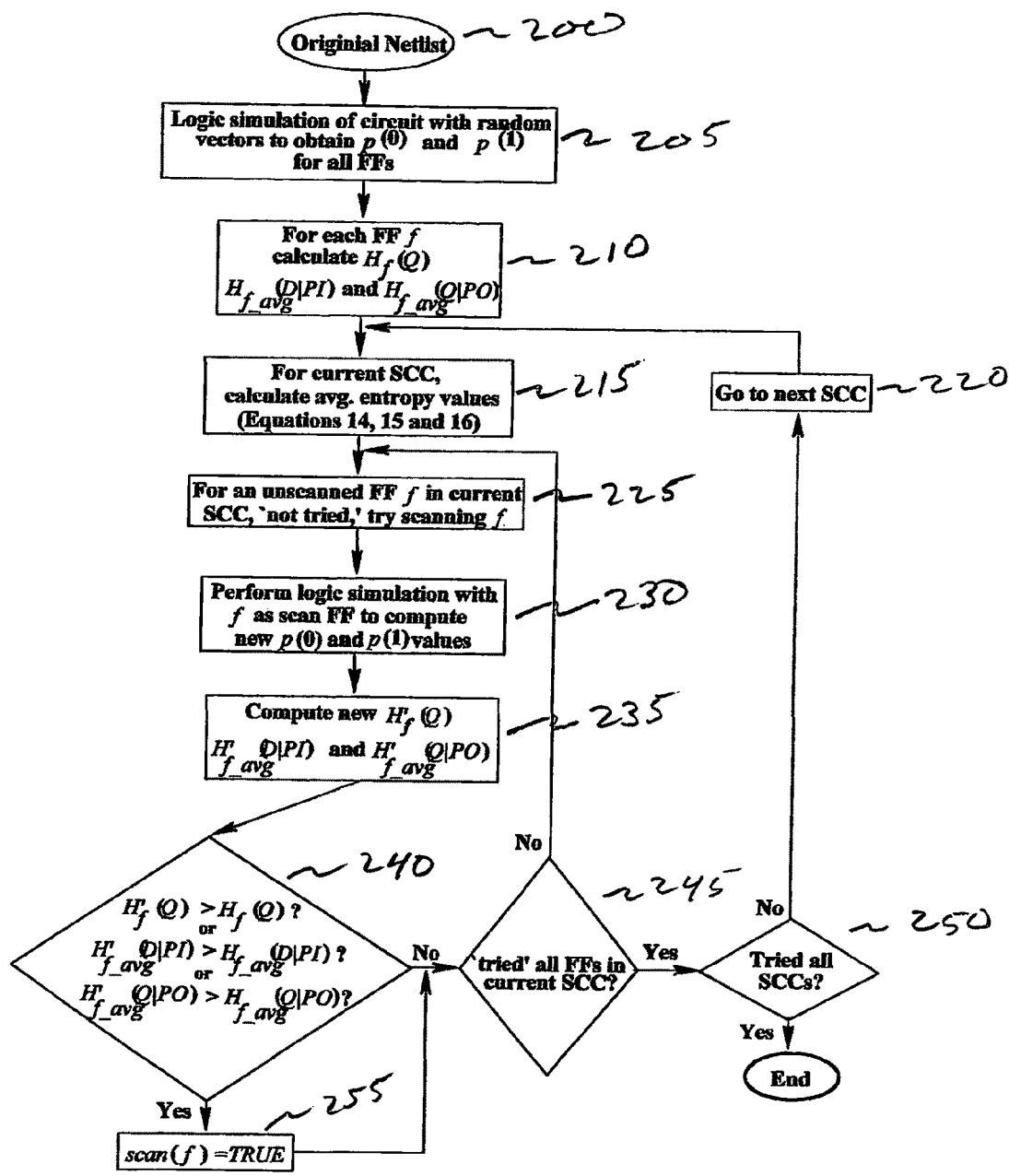
Figure 11: Procedure 2 — SPARTAN's entropy SFF selection.

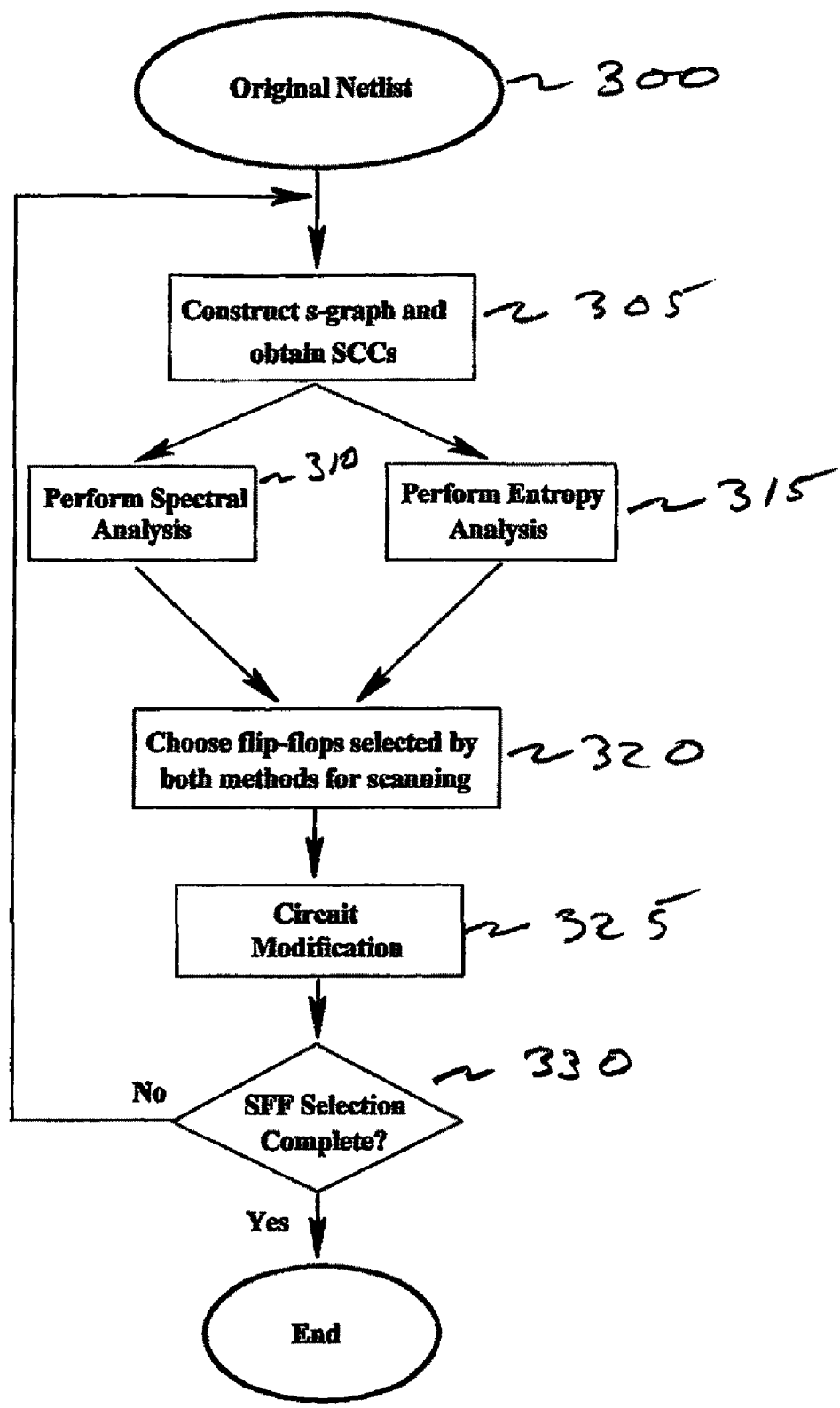
Figure 12: SPARTAN's SFF selection procedure.

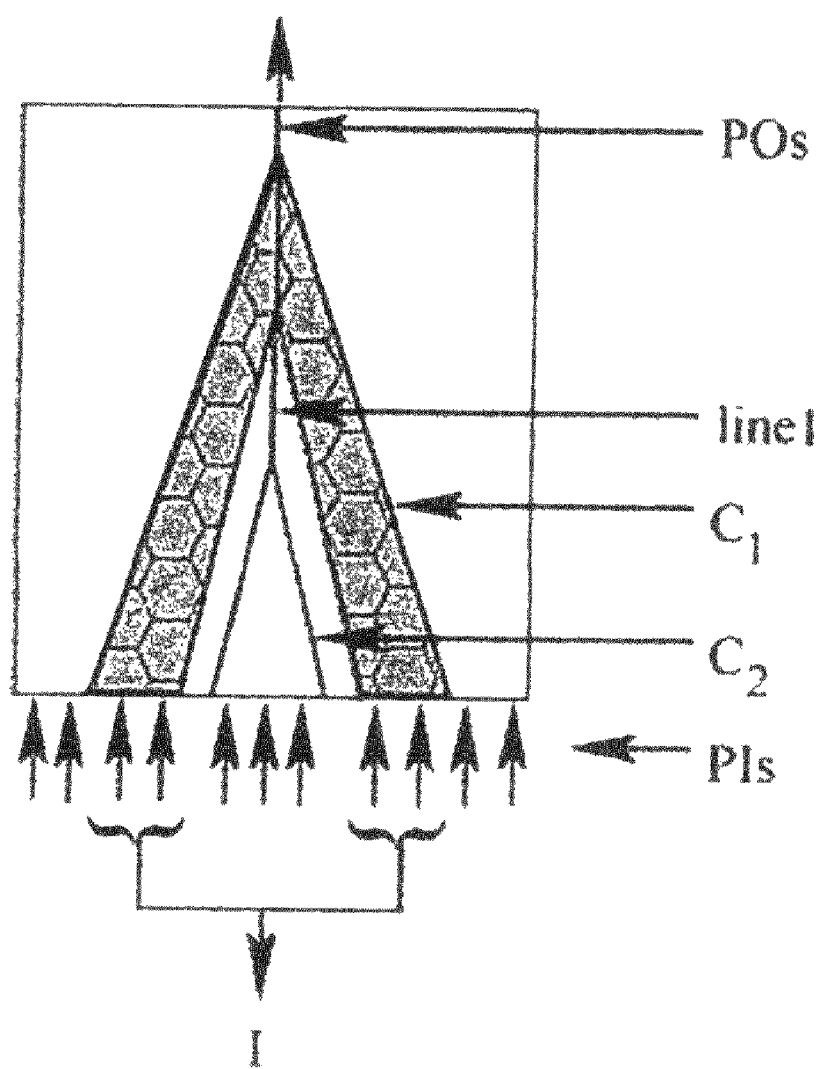
Figure 13: Example of circuit with observability PI set $I$.

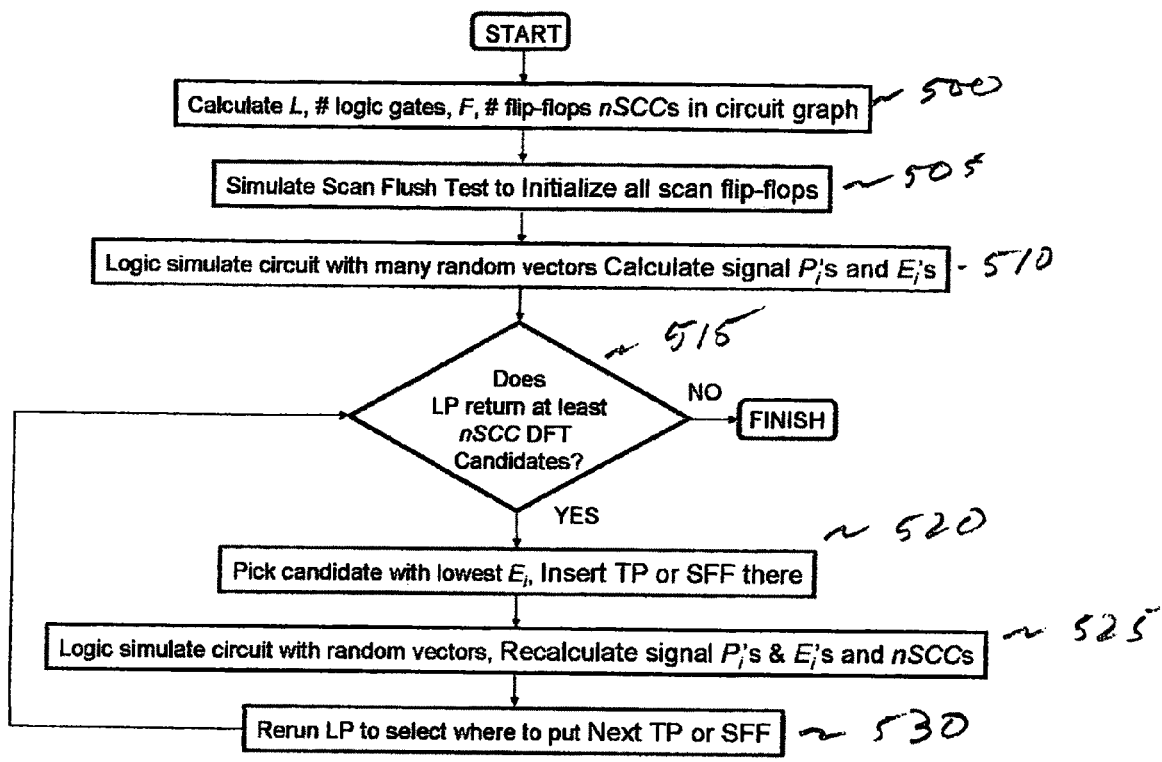
Figure 14: Flow chart for TPI algorithm with Linear Programming step.

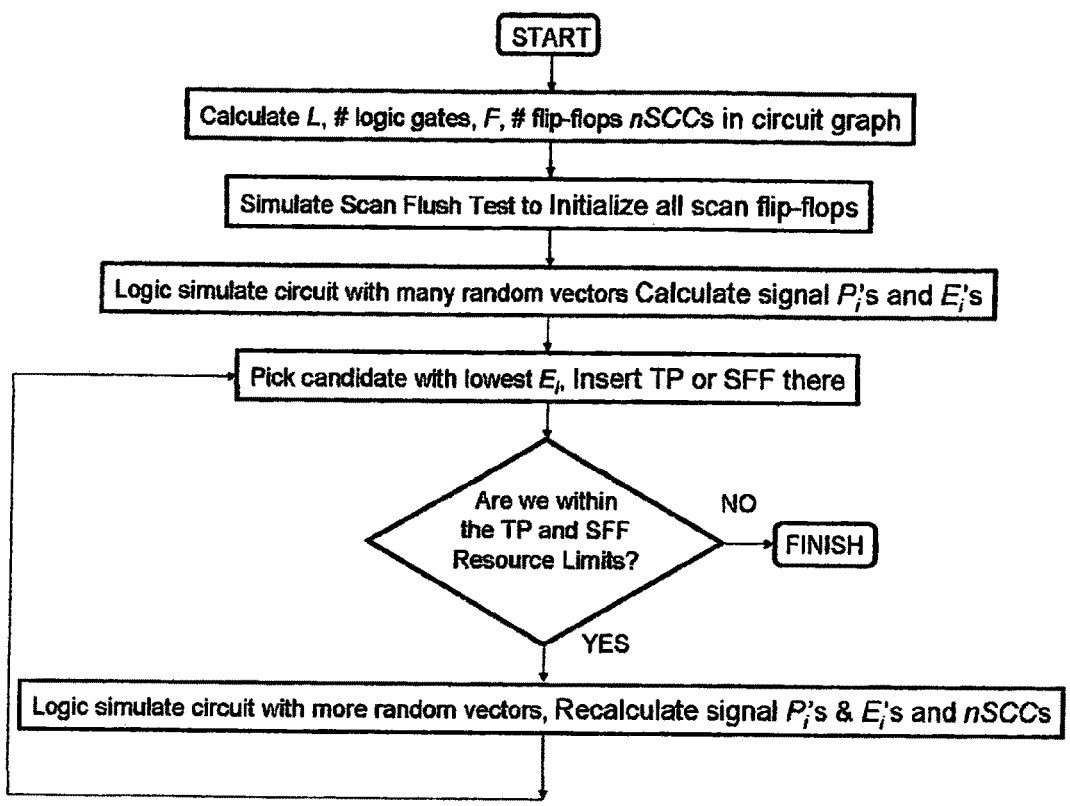
Figure 15: Flow chart for gradient descent TPI algorithm.

SPECTRAL AND INFORMATION THEORETIC METHOD OF TEST POINT, PARTIAL-SCAN, AND FULL-SCAN FLIP-FLOP INSERTION TO IMPROVE INTEGRATED CIRCUIT TESTABILITY

CROSS REFERENCE TO RELATED APPLICATIONS

This application claims priority from U.S. Provisional Application Ser. No. 61/054,046, filed May 16, 2008, and U.S. Provisional Application Ser. No. 61/109,245, filed Oct. 29, 2008, the entire disclosures of which are hereby incorporated by reference.

BACKGROUND OF THE INVENTION

The present invention relates to testing integrated circuits, either before or after they are inserted into chip packages. In particular, this application provides a method and algorithm for automatically inserting the necessary hardware test structures into any digital integrated circuit, in order to drastically reduce the cost of testing.

DESCRIPTION OF RELATED ART

Williams and Angell introduced full-scan design where test hardware is added to every flip-flop in the digital integrated circuit, as described in M. J. Williams and J. B. Angell, "Enhancing Testability of Large-Scale Integrated Circuits via Test Points and Additional Logic," IEEE Trans. on Computers, C-22 (1): 46-60, January, 1973. MUXes are placed on the inputs to all flip-flops, so that they can either operate in normal functional mode, or can behave as a shift register to shift in their state serially from a pin called scan input (SI) or shift out their state serially to a pin called scan output (SO) or both. Partial-scan is simply a technique where only a subset of the most difficult-to-test flip-flops receives the scan hardware. Partial-scan insertion algorithms are based on the minimum feedback vertex set, as described in S. T. Chakradhar, A. Balakrishnan, and V. D. Agrawal, "An Exact Algorithm for Selecting Partial Scan Flip-Flops," Proc. of the 31st Design Automation Conf., pp. 81-86, June, 1994; K.-T. Cheng and V. D. Agrawal, "A Partial Scan Method for Sequential Circuits with Feedback," IEEE Trans. on Computers, 39(4): 544-548, April, 1990; N. Deo, "Graph Theory with Applications to Engineering and Computer Science," Prentice-Hall, Inc., 1974, Englewood Cliffs, N.J.; and D. H. Younger, "Minimum Feedback Arc Sets for a Directed Graph," IEEE Trans. on Circuits and Systems, CT-10(2): 238-245, June, 1963. Partial-scan insertion can also be based on circuit structure and state transitions, as described in P. Ashar and S. Malik, "Implicit Computation of Minimum-Cost Feedback Vertex Sets for Partial Scan and Other Applications," Proc. of the Design Automation Conf., pp 77-80, 1994; S. Bhawmik, C. Cheng, K.-T. Cheng, and V. D. Agrawal, "PASCANT: A Partial Scan and Test Generation System," Proc. of the IEEE Custom Integrated Circuits Conf., pp 17.3/1-17.3/4, May, 1991; K.-T. Cheng, "Single-Clock Partial Scan," IEEE Design and Test of Computers, 12(2): 24-31, Summer, 1995; V. Chickermane and J. Patel, "An Optimization Based Approach to Partial Scan Problem," Proc. of the Int'l. Test Conf., pp 377-386, October, 1990; F. Corno, P. Prinetto, M. Sonza Reorda, and M. Violante, "Exploiting Symbolic Techniques for Partial Scan Flip-Flop Selection," Proc. of the IEEE Design Automation and Test in Europe, pp 670-677, February, 1998; A. Kunzmann and H.-J. Wunderlich, "An Analytical Approach to the Partial Scan Problem," J. of Electronic Testing and Test Applications, 1(2): 163-174, May, 1990; D. Lee and S. M. Reddy, "On Determining Scan Flip-Flops in Partial-Scan Designs," Proc. of the Int'l. Conf. on CAD, pp. 322-325, November, 1990; S. Park, "A Partial Scan Design Unifying Structural Analysis and Testabilities," Int'l. J. on Electronics, 88(12): 1237-1245, Dec., 2001; and S. E. Tai and D. Bhattacharya, "A Three Stage Partial Scan Design Method to Ease ATPG," J. of Electronic Testing and Test Applications, 7(11): 95-104, November, 1995.

Partial-scan insertion can also be based on testability measures, as described in M. Abramovici, J. J. Kulikowski, and R. R. Roy, "The Best Flip-Flops to Scan," Proc. of the IEEE Int'l. Test Conf., pp 166-173, 1991; V. Boppana and W. K. Fuchs, "Partial Scan Design Based on State Transition Modeling," Proc. of the IEEE Int'l. Test Conf., pp 538-547, 1996; V. Chickermane and J. Patel, "An Optimization Based Approach to Partial Scan Problem," Proc. of the Int'l. Test Conf., pp 377-386, October, 1990; P. Kalla and M. J. Ciesielski, "A Comprehensive Approach to the Partial Scan Problem Using Implicit State Enumeration," IEEE Trans. on Computer-Aided Design of Integrated Circuits and Systems, 21(7): 810-826, July, 2002; P. Kalla and M. J. Ciesielski, "A Comprehensive Approach to the Partial Scan Problem Using Implicit State Enumeration," Proc. of the IEEE Int'l. Test Conf., pp 651-657, 1998; P. S. Parikh and M. Abramovici, "Testability-Based Partial Scan Analysis," J. of Electronic Testing and Test Applications, 7(1/2): 61-70, August/October, 1995; S. Park, "A Partial Scan Design Unifying Structural Analysis and Testabilities," Int'l. J. on Electronics, 88(12): 1237-1245, December, 2001; G. S. Saund, M. S. Hsiao, and J. Patel, "Partial Scan Beyond Cycle Cutting," Proc. of the IEEE Int'l. Symp. on Fault-Tolerant Computing, pp 320-328, 1997; E. Trischler, "Incomplete Scan Path with an Automatic Test Generation Methodology," Proc. of the IEEE Int'l. Test Conf., pp 153-162, October, 1980; and D. Xiang, S. Venkataraman, W. K. Fuchs, and J. H. Patel, "Partial Scan Design Based on Circuit State Information," Proc. of the Design Automation Conf., pp 807-812, June, 1996. It can be based on automatic test-pattern generation (ATPG) algorithms, as described in V. D. Agrawal, K.-T. Cheng, D. D. Johnson, and T. Lin, "Designing Circuits with Partial Scan," IEEE Design & Test of Computers, 5(2): 8-15, April, 1988; M. S. Hsiao, G. S. Saund, E. M. Rudnick, and J. H. Patel, "Partial Scan Selection Based on Dynamic Reachability and Observability Information," Proc. of the Int'l. Conf. on VLSI Design, pp 174-180, January, 1998; H. C. Liang and C. L. Lee, "Effective Methodology for Mixed Scan and Reset Design Based on Test Generation and Structure of Sequential Circuits," Proc. of the 8th IEEE Asian Test Symp., pp 173-178, 1999; X. Lin, I. Pomeranz, and S. M. Reddy, "Full Scan Fault Coverage with Partial Scan," Proc. of the IEEE Design Automation and Test in Europe, pp 468-472, 1999; I. Park, D. S. Ha, and G. Sim, "A New Method for Partial Scan Design Based on Propagation and Justification Requirements of Faults," Proc. of the IEEE Int'l. Test Conf., pp 413-422, October, 1995; and S. Sharma and M. Hsiao, "Combination of Structural and State Analysis for Partial Scan," Proc. of the Int'l. Conf. on VLSI Design, pp 134-139, January 2001. It can also be based on synchronizing sequences, as described in N. Jiang, R. M. Chou, and K. K. Saluja, "Synthesizing Finite State Machines for Minimum Length Synchronizing Sequence Using Partial Scan," Proc. of the IEEE Int'l. Symp. on Fault-Tolerant Computing, pp 41-49, 1995; fault lists, as described in V. Chickermane and J. H. Patel, "A Fault Oriented Partial Scan Design Approach," Proc. of the Int'l. Conf. on CAD, pp 400-403, November, 1991; k-scan chains, as described in S, Narayanan, R. Gupta, and M. A. Breuer, "Optimal Configuring of Multiple Scan Chains," IEEE Trans. on Computers, 42(9): 1121-1131, September, 1991; and on state and signal conflict analysis, as described in D. Xiang and J. Patel, "A Global Partial Scan Design Algorithm Using State Information," Proc. of the IEEE Int'l. Test Conf., pp 548-557, October, 1996. Partial-scan design methods exist, as described in V. D. Agrawal, "Editorial: Special Issue on Partial Scan Methods," J. of Electronic Testing and Test Applications, 7(1/2), August-October, 1995; V. D. Agrawal, K.-T. Cheng, D. D. Johnson, and T. Lin, "Designing Circuits with Partial Scan," IEEE Design & Test of Computers, 5(2): 8-15, April, 1988; S. T. Chakradhar, A. Balakrishnan, and V. D. Agrawal, "An Exact Algorithm for Selecting Partial Scan Flip-Flops," J. of Electronic Testing and Test Applications, 7(1-2): 83-93 August-October, 1995; K.-T. Cheng and V. D. Agrawal, "A Partial Scan Method for Sequential Circuits with Feedback," IEEE Trans. on Computers, 39(4): 544-548, April, 1990; V. Chickermane and J. H. Patel, "A Fault Oriented Partial Scan Design Approach," Proc. of the Int'l. Conf. on CAD, pp 400-403, November, 1991; S. Dey and S. T. Chakradhar, "Design of Testable Sequential Circuits by Repositioning Flip-Flops," J. of Electronic Testing and Test Applications, 7(1/2): 105-114, August/October, 1995; R. Gupta, R. Gupta, and M. A. Breuer, "The BALLAST Methodology for Structured Partial Scan Design," IEEE Trans. on Computers, 39(4): 538-544, April, 1990; K. S. Kim and C. R. Kime, "Partial Scan Flip-Flop Selection by Use of Empirical Testability," J. of Electronic Testing and Test Applications, 7(1/2): 47-60, August/October, 1995; A. Kunzmann and H.-J. Wunderlich, "An Analytical Approach to the Partial Scan Problem," J. of Electronic Testing and Test Applications, 1(2): 163-174, May, 1990; D. Lee and S. M. Reddy, "On Determining Scan Flip-Flops in Partial-Scan Designs," Proc. of the Int'l. Conf. on CAD, pp. 322-325, November, 1990; C. H. Lin, Y. Zorian, and S. Bhawmick, "PBIST: A Partial Scan Based BIST Scheme," Proc. of the Int'l. Test Conf., pp 507-516, October, 1993; H. B. Min and W. A. Rogers, "A Test Methodology for Finite State Machines using Partial Scan Design," J. of Electronic Testing and Test Applications, 3(2): 127-137, May, 1992; P. S. Parikh and M. Abramovici, "Testability-Based Partial Scan Analysis," J. of Electronic Testing and Test Applications, 7(1/2): 61-70, August/October, 1995; S. Park and S. B. Akers, "A Graph Theoretic Approach to Partial Scan Design by K-Cycle Elimination," Proc. of the Int'l. Conf. on CAD, pp 303-311, 1992; E. Trischler, "Incomplete Scan Path with an Automatic Test Generation Methodology," Proc. of the IEEE Int'l. Test Conf., pp 153-162, October 1980; and D. M. Wu, M. Lin, S. Mitra, K. S. Kim, A. Subbavarapu, T. Jaber, P. Johnson, D. March, and G. Parrish, "H-DFT: A Hybrid DFT Architecture for Low-Cost High Quality Structural Testing," pp 1229-1238, Proc. of the Int'l. Test Conf., September/October, 2003. Xiang and Patel presented multi-phase partial-scan algorithms (opscan and mpscan). Partial-scan is divided into a critical cycle breaking phase and a partial flip-flop selection with respect to conflict resolution phase. Structure-based methods have been the most successful. Test point insertion (TPI) is used for both ATPG and BIST, as described in K. Balakrishnan, "A Dynamic Programming Approach to the Test Point Insertion Problem," Proc. of the Design Automation Conf., pp 195-705, June, 1987; I. Berger and Z. Kohavi, "Fault Detection in Fanout-Free Combinational Networks," IEEE Trans. on CAD, C-22(10): 908-914, 1973; A. J Briers and K. A. E. Totton, "Random Pattern Testability by Fast Fault Simulation," Proc. of the Int'l. Test Conf., pp 274-281, 1986; M. J. Guezebroek, J. T. van der Linden, and A. J. van de Goor, "Test Point Insertion for Compact Test Sets," Proc. of the Test Conf., pp 292-301, 2000; M. J. Guezebroek, J. T. van der Linden, and A. J. van de Goor, "Test Point Insertion that Facilitates ATPG in Reducing Test Time and Data Volume," Proc. of the Int'l. Test Conf., pp 138-147, 2002; J. P. Hayes and A. D. Friedman, "Test Point Placement to Simplify Fault Detection," Proc. of the Fault-Tolerant Computing Symp., pp 73-78, 1973; V. S. Iyengar and D. Brand, "Synthesis of Pseudo-Random Pattern Testable Designs," Proc. of the Int'l. Test Conf., pp 501-508, 1989; M. Nakao, S. Kobayashi, K. Hatayama, K. Iilima, and S. Terada, "Low Overhead Test Point Insertion for Scan-based BIST," Proc. of the Test Conf., pp 348-357, 1999; B. Seiss, P. Trouborst, and M. Schulz, "Test Point Insertion for Scan-based BIST," Proc. of the European Design Automation Conf., pp 253-262, 1991; R. Sethuram, S. Wang, S. T. Chakradhar, and M. L. Bushnell, "Zero Cost Test Point Insertion Technique to Reduce Test Set Size and Test Generation Time for Structured ASICs," Proc. of the Asian Test Symp., pp 339-348, November, 2006; N. Tamarapalli and J. Rajski, "Constructive Multi-Phase Test Point Insertion for Scan-Based BIST," Proc. of the Test Conf., pp 649-658, October, 1996; N. A. Touba and E. J. McCluskey, "Test Point Insertion Based on Path Tracing," Proc. of the VLSI Test Symp., pp 2-8, Apr.-May, 1996; and M. Yoshimura, T. Hosokawa, and M. Ohta, "A Test Point Insertion Method to Reduce the Number of Test Patterns," Proc. of the Asian Test Symp., pp 198-203, November, 2002. SCOAP measures, as described in L. H. Goldstein and E. L. Thigpen, "SCOAP: Sandia Controllability/Observability Analysis Program," pp 190-196, June, 1980; COP measures, as described in F. Brglez, P. Pownall, and P. Hum, "Applications of Testability Analysis: From ATPG to Critical Path Tracing," Proc. of the Int'l. Test Conf., pp 705-712, 1984; and test counting measures, as described in K. Balakrishnan, "A Dynamic Programming Approach to the Test Point Insertion Problem," Proc. of the Design Automation Conf., pp 195-705, June, 1987 and J. P. Hayes and A. D. Friedman, "Test Point Placement to Simplify Fault Detection," Proc. of the Fault-Tolerant Computing Symp., pp 73-78, 1973, are used for TPI.

Definition of Entropy

Information theory is useful in combating noise-related errors of communication. Information theoretic measures such as entropy also apply to physics (statistical mechanics), mathematics (probability theory), electrical engineering (communication theory), and computer science (algorithmic complexity). Equation 1 shows the general definition of entropy for a random variable (RV) X with a probability mass function (PMF) p (x). A PMF is the discrete version of a probability density function (PDF). Variable x varies over all possible values of X. Shannon entropy E is an effective measure of randomness in data. It is widely used as a measure of information in signals that have n distinct values, as described in R. Mester and U. Franke, "Spectral Entropy-Activity Classification in Adaptive Transform Coding," IEEE J. of Selected Areas in Communications, 10(5): 913-917, June, 1992; W. Yang and J. D. Gibson, "Coefficient Rate and Significance Maps in Transform Coding," Record of Thirty-First Asilomar Conf. on Signals, Systems and Computers, 2: 1373-1377, November, 1997; and W. Yang and J. D. Gibson, "Spectral Entropy, Equivalent Bandwidth and Minimum Coefficient Rate," Proc. of the Int'l. Symp. on Information Theory, pp 181, June-July, 1997.

$$E = -\sum_{i=1}^{n} p_i \log_2(p_i) \tag{1}$$

where $p_i$ = probability of outcome $i$

Entropy is the number of bits (information), on average, required to encode a RV. The maximum value of the entropy of a signal is 1.0, which occurs when all possibilities of the signal are equally likely. Consider an 8-input AND gate, with p (0)=p (1)=0.5 on each input. From SCOAP measures, as described in L. H. Goldstein, "Controllability/Observability Analysis of Digital Circuits," IEEE Trans. on Circuits and Systems, CAS-26(9): 685-693, September, 1979, the difficulty of setting the output to a 1 is CC (1)=9, and the difficulty of setting it to a 0 is CC (0)=2. From COP measures, the probability of the output being 1 is p (1)=1/256 and p (0)=255/256. However, the entropy measure of the output, which incorporates both 0 and 1 probabilities, is 0.03687. The advantage of using entropy, rather than conventional testability measures, is that it is a single metric that accurately reflects the information flow in the circuit, and also it can be reliably calculated using a limited number of simulation vectors.

Example 1

Consider a RV X that has a uniform distribution and has 32 equiprobable outcomes. The entropy of X is:

$$H(X) = -\sum_{x=1}^{32} p_x \log_2(p_x)$$
$$= -32 \times \left(\frac{1}{32} \log_2\left(\frac{1}{32}\right)\right)$$
$$= 5 \text{ bits}$$

which agrees with the number of bits needed to describe X.

For logic circuits, each line is a RV with 2 possible outcomes—logic 0 and logic 1. Entropy of a wire is:

$$H(X) = -((1-p)\log_2(1-p) + p \log_2(p)) \quad (2)$$

where p is the probability of logic 1 occurring at a line. Equation 2 is plotted in FIG. 1 with H (X=p) on the ordinate and p on the abscissa. Maximum entropy occurs when 0 and 1 are equally likely.

Dussault proposed the first information theoretic testability measure, as described in J. A. Dussault, "A Testability Measure," Proc. of the IEEE 1978 Semiconductor Test Conf., pp 113-116, October, 1978. Mutual information (MI), I (X;Y), in Equation 3 is a measure of dependence between two RVs. H(X|Y) is the conditional entropy of a RV X if we know the value of a second RV Y (see Equation 4), as described in T. Cover and J. Thomas, "Elements of Information Theory," John Wiley & Sons Inc., 2006, Hoboken, N.J. Equation 5 gives I (X;Y), the reduction in the uncertainty of X due to the knowledge of Y. I (X;Y) is 0 if X and Y are independent RVs. For binary logic, X, Y ∈ (0,1). Equations 6-8 show the proposed testability measures. Circuit inputs (outputs) are represented by the RV vector X (Y).

$$I(X; Y) = \sum_{\substack{x \in X \\ y \in Y}} p(x, y) \log_2 \frac{p(x, y)}{p(x)p(y)} = I(Y; X) \quad (3)$$

$$H(X \mid Y) = \sum_{y \in Y} p(y) H(X \mid Y = y) \quad (4)$$

$$I(X; Y) = H(X) - H(X \mid Y) \quad (5)$$

$$\text{Observability} = \frac{1}{H(X \mid Y)} \quad (6)$$

$$\text{Controllability} = \frac{1}{H(Y \mid X)} \quad (7)$$

$$\text{Testability} = I(X; Y) \quad (8)$$

H(X|Y) gives the uncertainty in inputs X given that outputs Y are known. The less the uncertainty, the greater the amount of information about inputs reaching the outputs, implying higher observability. Equation 6 gives the observability since observability and uncertainty H(X|Y) are inversely proportional. Similarly, Equation 7 gives the controllability. Overall circuit testability is given by I (X;Y), where large values indicate high testability.

Agrawal proposed an information theoretic approach to testing digital circuits, as described in V. D. Agrawal, "An Information Theoretic Approach to Digital Fault Testing," IEEE Transactions on Computers, C-30(8): 582-587, August, 1981., and derived the probability P (T) of detecting a stuck-at fault by a vector sequence T by analyzing the information throughput of the circuit. The probability of detecting a fault by a vector sequence T is:

$$P(T) = 1 - 2^{-H_o \times T/k}$$

where k is the number of lines through a circuit partition where the detectable fault exists and $H_o$ is the entropy at the output of the circuit. Consider a 2-input AND gate with inputs i1, i2 and output Z. If the probability of logic 0 (logic 1) occurring at the inputs is 0.5 (0.5), the entropies at the inputs, i1 and i2, are:

$$H_{i1} = H_{i2} = -0.5 \times \log_2(0.5) - 0.5 \times \log_2(0.5) = 1.0$$

Therefore, the total information present at the inputs is 1+1=2. The probability of logic 0 (logic 1) at output Z is 0.75 (0.25) and the entropy of Z is:

$$H_Z = -0.25 \log_2(0.25) - 0.75 \log_2(0.75) = 0.811$$

So, the AND gate has information loss of 2.0−0.811=1.189. Agrawal proposed an ATPG method that reduces the loss (by increasing entropy) of information and maximizes P (T) in the circuit by adjusting the probabilities of 0 and 1 at the inputs.

Thearling and Abraham proposed information theory based testability measures at the functional level, as described in K. Thearling and J. Abraham, "An Easily Computed Functional Level Testability Measure," Proc. of the Int'l. Test Conf., pp 381-390, October, 1989. They also proposed partitioning of the circuit, to improve testability, using entropy-related measures. Probabilities of logic 0 (logic 1), p (0) (p (1)), were estimated either via logic simulation, called sampling, or by using functional level information of the circuit components, known as composition.

Darmala and Karpovsky have proposed fault detection techniques in combinational circuits using spectral transforms, as described in T. Darmala and M. Karpovsky, "Fault Detection in Combinational Networks by Reed-Muller Transforms," IEEE Trans. on Computers, 38(3): 788-797, June, 1989, and M. Karpovsky, R. Stankovic, and J. Astola, "Spectral Techniques for Design and Testing of Computer Hardware," Proc. of the Int'l Workshop for Spectral Techniques in Logic Design, pp 1-34, June, 2000. In many fields such as communications, digital signal processing, etc., analysis in the spectral (frequency) domain provides a better intuition of the signal properties than analysis in the time domain. Spectral techniques have also been used for fault detection, as described in S. L. Hurst, D. M. Miller, and J. C. Muzio, "Spectral Techniques in Digital Logic," Academic Press Inc., 1985, London, and sequential ATPG, as described in S. Devanathan and M. L. Bushnell, "Sequential Spectral ATPG Using the Wavelet Transform and Compaction," Proc. of the Int'l. Conf. on VLSI Design, pp 407-412, January, 2006 and J. Zhang, M. L. Bushnell, and V. D. Agrawal, "On Random Pattern Generation with the Selfish Gene Algorithm for Testing Digital Sequential Circuits," Proc. of the Int'l. Test Conf., pp 617-626, October, 2004.

SUMMARY OF THE INVENTION

Design for testability (DFT) algorithms, which use both gradient descent and linear programming (LP) algorithms to insert test points (TPs) and/or scanned flip-flops (SFFs) into large circuits to make them testable, are described. Scanning of either all flip-flops or a subset of flip-flops is supported. The algorithms measure testability using probabilities computed from logic simulation, Shannon's entropy measure (from information theory), and spectral analysis of the circuit in the frequency domain. The DFT hardware inserter methods use toggling rates of the flip-flops (analyzed using digital signal processing (DSP) methods) and Shannon entropy measures of flip-flops to select flip-flops for scan. The optimal insertion of the DFT hardware reduces the amount of DFT hardware, since the gradient descent and linear program optimizations trade off inserting a TP versus inserting an SFF. The linear programs find the optimal solution to the optimization, and the entropy measures are used to maximize information flow through the circuit-under-test (CUT). The methods limit the amount of additional circuit hardware for test points and scan flip-flops to less than 10% of the original hardware. The results, on full-scan designs, are a 35.49% reduction in test data volume (TV) and a 54.99% reduction in test application time (TAT), compared to a conventional, industrial-strength combinational automatic test-pattern generator (ATPG) using full-scan design. The methods reduce the number of test vectors by 55.24%. The methods reduce ATPG computation time by 88.76%, due to better circuit testability. The methods, used in conjunction with an ATPG, achieve 0.19% higher fault efficiency (or test efficiency (TE)) and 1.56% higher fault coverage (FC) compared to conventional industrial methods on large circuits. The methods work better than all prior methods on partial-scan circuits, as well.

In an embodiment of the present invention a method is described for inserting test points and scan flip flops into a digital circuit comprising computing a median location of the digital circuit; specifying a range within the digital circuit around the median location to be considered as test point sites; randomly selecting test point sites within the range for inserting test points; determining suitability of the randomly selected test point sites by performing a spectral analysis for scan flip-flop selection of the digital circuit using the randomly selected test point sites; determining suitability of the randomly selected test point sites by performing an entropy analysis for test point selection in the digital circuit using the randomly selected test point sites; selecting a plurality of test point sites from the randomly selected test point sites if the spectral analysis and the entropy analysis determine that the plurality of test point sites are suitable; performing primary input overlap analysis to remove as many dependent test point sites as possible from the plurality of test point sites to make the digital circuit easier to test; and inserting remaining test point sites into the digital circuit.

In another embodiment of the present invention a method is described that comprises the step determining suitability of the randomly selected test point sites by performing an entropy analysis for test point selection of the digital circuit using the randomly selected test point sites and further comprises determining statistical unbiasing to account for misinformation. In another embodiment of the present invention a method is described that comprises the step determining suitability of the randomly selected test point sites by performing an entropy analysis for test point selection of the digital circuit using the randomly selected test point sites and further comprises calculating entropy gain and/or simple entropy as a testability measure. In yet another embodiment of the present invention a method is described that comprises the step determining suitability of the randomly selected test point sites by performing a spectral analysis for scan flip-flop selection of the digital circuit using the randomly selected test point sites and the step determining suitability of the randomly selected test point sites by performing an entropy analysis for test point selection of the digital circuit using the randomly selected test point sites, which are performed simultaneously.

In another embodiment of the present invention a method is described that comprises simulating the digital circuit and generating random input vectors to obtain valid flip-flop states and primary output values; determining all spectral coefficients of each flip-flop and primary output in the digital circuit; determining an average spectral coefficient for each flip-flop; tracking a minimum average spectral coefficient and a maximum average spectral coefficient from the average spectral coefficient for each flip-flop; comparing each flip-flop average spectral coefficient to its primary output spectral coefficients and if a flip-flop average spectral coefficient matches any one of its primary output spectral coefficients, then the flip-flop is considered observable; calculating a threshold spectral coefficient using the minimum average spectral coefficient and the maximum average spectral coefficient applied to the entire digital circuit; and marking the flip-flops as scanned candidates if the flip-flops are not considered observable and the average spectral coefficients are less than the threshold spectral coefficient.

In a embodiment of the present invention a method is described for inserting test points and scan flip flops into a digital circuit comprising computing a median location of the digital circuit; specifying a range within the digital circuit around the median location to be considered as test point sites; performing primary input overlap analysis to remove as many dependent test point sites as possible from the range within the digital circuit to make the digital circuit easier to test; determining suitability of remaining test point sites by performing a spectral analysis for scan flip-flop selection of the digital circuit using the remaining selected test point sites; determining suitability of the remaining selected test point sites by performing an entropy analysis for test point selection of the digital circuit using the remaining selected test point sites; selecting a test point site if the spectral analysis and the entropy analysis determine that the test point site is suitable; and inserting the test point site into the digital circuit.

In another embodiment of the present invention a method is described that comprises the step determining suitability of the remaining selected test point sites by performing an entropy analysis for test point selection of the digital circuit using the remaining selected test point sites further comprises determining statistical unbiasing to account for misinformation. In another embodiment of the present invention a method is described that comprises the step determining suitability of the remaining selected test point sites by performing an entropy analysis for test point selection of the digital circuit using the remaining selected test point sites further comprises calculating entropy gain and/or simple entropy as a testability measure. In yet another embodiment of the present invention a method is described that comprises the step determining suitability of the remaining test point sites by performing a spectral analysis for scan flip-flop selection of the digital circuit using the remaining selected test point sites and the step determining suitability of the remaining selected test point sites by performing an entropy analysis for test point selection of the digital circuit using the remaining selected test point sites are performed simultaneously.

In an embodiment of the present invention a method is described that comprises simulating the digital circuit and generating random input vectors to obtain valid flip-flop states and primary output values; determining all spectral coefficients of each flip-flop and primary output in the digital circuit; determining an average spectral coefficient for each flip-flop; tracking a minimum average spectral coefficient and a maximum average spectral coefficient from the average spectral coefficient for each flip-flop; comparing each flip-flop average spectral coefficient to its primary output spectral coefficients and if a flip-flop average spectral coefficient matches any one of its primary output spectral coefficients, then the flip-flop is considered observable; calculating a threshold spectral coefficient using the minimum average spectral coefficient and the maximum average spectral coefficient applied to the entire digital circuit; and marking the flip-flops as scanned candidates if the flip-flops are not considered observable and the average spectral coefficients are less than the threshold spectral coefficient.

In an embodiment of the present invention a method is described for inserting test points and scan flip flops into a digital circuit comprising calculating a number of logic gates, a number of flip-flops and a number of strongly-connected components in the digital circuit; simulating a scan flush test to initialize all scan flip-flops; logic simulating the digital circuit with random input vectors and calculating signal probabilities and signal entropies; executing a linear program that returns at least one strongly-connected component design-for-testability test point site; selecting a test point site from the at least one strongly-connected component design-for-testability test point sites with the lowest signal entropy and inserting a test point or scan flip-flop at the test point site in the digital circuit; logic simulating the digital circuit with a number of random input vectors and recalculating signal probabilities and signal entropies in at least one strongly-connected component; selecting where to put the test point or the scan flip-flop in the digital circuit based on the site with lowest signal entropy; and if the site with the lowest signal entropy is a logic gate, insert a test point, and if the site with the lowest signal entropy is a flip-flop, scan the flip-flop.

In another embodiment of the present invention a method is described that comprises the step logic simulating the digital circuit with random input vectors and calculating signal probabilities and signal entropies further comprises determining statistical unbiasing to account for misinformation. In another embodiment of the present invention a method is described that comprises the step logic simulating the digital circuit with random input vectors and calculating signal probabilities and signal entropies further comprises calculating entropy gain and/or simple entropy as a testability measure. In yet another embodiment of the present invention a method is described that comprises the step logic simulating the digital circuit with random input vectors and calculating signal probabilities and signal entropies further comprises calculating signal probabilities and signal entropies simultaneously.

In an embodiment of the present invention a method is described for inserting test points into a digital circuit comprising calculating a number of logic gates in a digital circuit; logic simulating the digital circuit with random input vectors and calculating signal probabilities and signal entropies; executing a linear program that returns at least one design-for-testability test point site; selecting a test point site from the at least one design-for-testability test point sites with the lowest signal entropy and inserting a test point at the test point site in the digital circuit; logic simulating the digital circuit with a number of random input vectors and recalculating signal probabilities and signal entropies; and selecting where to put the test point in the digital circuit based on the site with the lowest signal entropy; and if the site with the lowest signal entropy is a logic gate, insert a test point, and if the site with the lowest signal entropy is a flip-flop, scan the flip-flop.

In another embodiment of the present invention a method is described that comprises the step logic simulating the digital circuit with random signals and calculating signal probabilities and signal entropies further comprises determining statistical unbiasing to account for misinformation. In yet another embodiment of the present invention a method is described that comprises the step logic simulating the digital circuit with random signals and calculating signal probabilities and signal entropies further comprises calculating entropy gain and/or simple entropy as a testability measure. In another embodiment of the present invention a method is described that comprises the step logic simulating the digital circuit with random signals and calculating signal probabilities and signal entropies further comprises calculating signal probabilities and signal entropies simultaneously.

In an embodiment of the present invention a method is described for inserting test points and scan flip flops into a digital circuit comprising setting a test hardware limit; calculating a number of logic gates, a number of flip-flops and a number of strongly-connected components in the digital circuit; simulating a scan flush test to initialize all scan flip-flops; logic simulating the digital circuit with random input vectors and calculating signal probabilities and signal entropies; selecting a test point site with a lowest signal entropy and inserting a test point or scan flip-flop at the test point site in the digital circuit; determining if the test hardware limit is reached and stopping if the test hardware limit is reached; logic simulating the digital circuit with a number of random input vectors and recalculating signal probabilities and signal entropies and the strongly-connected components; and returning to the step selecting a test point site.

In another embodiment of the present invention a method is described that comprises the step logic simulating the digital circuit with random input vectors and calculating signal probabilities and signal entropies further comprises determining statistical unbiasing to account for misinformation. In yet another embodiment of the present invention a method is described that comprises the step logic simulating the digital circuit with random input vectors and calculating signal probabilities and signal entropies further comprises calculating entropy gain and/or simple entropy as a testability measure. In another embodiment of the present invention a method is described that comprises the step logic simulating the digital circuit with random input vectors and calculating signal probabilities and signal entropies further comprises calculating signal probabilities and signal entropies simultaneously.

In another embodiment of the present invention a method is described for inserting test points into a digital circuit comprising setting a test hardware limit; calculating a number of logic gates in the digital circuit; logic simulating the digital circuit with random input vectors and calculating signal probabilities and signal entropies; selecting a test point site with a lowest signal entropy and inserting a test point at the test point site in the digital circuit; determining if the test hardware limit is reached and stopping if the test hardware limit is reached; logic simulating the digital circuit with a number of random input vectors and recalculating signal probabilities and signal entropies; and returning to the step selecting a test point site.

In another embodiment of the present invention a method is described that comprises the step logic simulating the digital circuit with random input vectors and calculating signal probabilities and signal entropies further comprises determining statistical unbiasing to account for misinformation. In yet another embodiment of the present invention a method is described that comprises the step logic simulating the digital circuit with random input vectors and calculating signal probabilities and signal entropies further comprises calculating entropy gain and/or simple entropy as a testability measure. In another embodiment of the present invention a method is described that comprises the step logic simulating the digital circuit with random input vectors and calculating signal probabilities and signal entropies further comprises calculating signal probabilities and signal entropies simultaneously.

BRIEF DESCRIPTION OF THE DRAWINGS

FIG. 1 is a drawing of H (p) vs p;
FIG. 2 is a drawing of an observation point;
FIG. 3 is a drawing of a control point;
FIG. 4 is a drawing of a complete test point;
FIG. 5 is a drawing of a single-clock scan flip-flop (SFF);
FIG. 6 is a drawing of an Orthogonal Radamacher-Walsh functions for n=3;
FIG. 7 is a flowchart of a SPARTAN spectral SFF selection procedure;
FIG. 8 is a flowchart of a SPARTAN spectral SFF selection procedure;
FIG. 9 is a flowchart of a spectral analysis procedure used for test point selection;
FIG. 10 is a flowchart of an entropy analysis procedure used for test point selection;
FIG. 11 is a flowchart of a SPARTAN entropy SFF selection procedure;
FIG. 12 is a flowchart of a SPARTAN SFF selection procedure.
FIG. 13 is an example of a circuit with observability PI set I;
FIG. 14 is a flowchart for a TPI algorithm with a Linear Programming step; and
FIG. 15 is a flowchart for a gradient descent TPI algorithm.

DETAILED DESCRIPTION

The processes, flowcharts, methods and systems described can be used in the process of manufacturing and testing of a wide variety of integrated circuits (e.g., very large scale integrated (VLSI) circuits, systems in a package (SIP), application specific integrated circuits (ASICs), programmable logic devices (PLDs) such as a field-programmable gate arrays (FPGAs), or systems-on-a-chip (SoCs), which utilize a wide variety of components (e.g., digital, analog, or mixed-signal components).

The processes, flowcharts and methods described can be implemented in a wide variety of environments. For example, any of the disclosed techniques can be implemented in whole or in part in software comprising computer-executable instructions stored on tangible computer-readable media (e.g., tangible computer-readable media, such as one or more CDs, volatile memory components (such as DRAM or SRAM), or nonvolatile memory components (such as hard drives)). The software can comprise, for example, electronic design automation (EDA) software tools (e.g., an automatic test pattern generator (ATPG) tool).

The processes, flowcharts and methods described can be executed on a single computer or on a networked computer (e.g., via the Internet, a wide-area network, a local-area network, a client-server network, or other such network). Any of the disclosed processes, flowcharts and methods can alternatively be implemented (partially or completely) in hardware (e.g., an ASIC, FPGA, PLD, or SoC).

Further, data produced from any of the disclosed processes, flowcharts and method described can be created, updated, or stored on tangible computer-readable media (e.g., tangible computer-readable media, such as one or more CDs, volatile memory components (such as DRAM or SRAM), or nonvolatile memory components (such as hard drives)) using a variety of different data structures or formats. Such data can be created or updated at a local computer or over a network (e.g., by a server computer).

Today's system in a package (SIP) designs can have up to 1 billion transistors, with increasingly high clocking rates. A very short test insertion time is necessary for the chip project to be economical, which requires really outstanding test point insertion, partial-scan insertion, and full-scan insertion tools. For such large circuits, it is impossible to test nearly 100% of the faults unless such test structures are inserted. The major economic need is to drastically reduce the TV and TAT for cores in these 1 billion transistor chips. The testing cost is alleviated by improving the circuit testability, using design-for-testability (DFT) techniques. Logic DFT consists of ad-hoc and structured techniques. Structured DFT is further split into scan (full and partial) and test point insertion (TPI) methods. The approach of this application uses a dramatically better test point insertion and flip-flop scanning algorithm, based on gradient descent and linear programming optimization, which outperform the prior art in every way. This DFT hardware inserter can be combined with the Mentor Graphics and Synopsys test compression methods, as described in E. J. McCluskey, D. Burek, B. Koenemann, S. Mitra, J. Patel, J. Rajski, and J. Waicukauski, "Test Data Compression," IEEE Design & Test of Computers, 20(2): 76-87, March-April, 2003; J. Rajski, "Test Compression—Real Issues and Matching Solutions," Proc. of the Int'l. Test Conf., Panel 5.4—pp 1-2, November, 2005; J. Rajski, M. Kassab, N. Mukherjee, N. Tamarapalli, J. Tyszer, and J. Qian, "Embedded Deterministic Test for Low-Cost Manufacturing, IEEE Design & Test of Computers," 20(5): 58-66, September-October, 2003; J. Rajski, N. Mukherjee, J. Tyszer, and T. Rinderknecht, "Embedded Test for Low Cost Manufacturing," Proc. of the Int'l. Conf. on VLSI Design, pp 21-23, January 2004; and J. Rajski, J. Tyszer, M. Kassab, and N. Mukherjee, "Embedded Deterministic Test," IEEE Trans. on CAD, 23(5): 776-792, May, 2004. It can also be used with a built-in self-testing (BIST) method, to drastically lower test costs.

Existing automated methods insert partial-scan or full-scan DFT hardware. However, for high-performance designs, the DFT insertion process is largely manual, because various performance and low power design constraints make it difficult to fully automate this. This leads to a very labor intensive process of an expert test engineer (often at the PhD level) inserting the DFT hardware by hand into a high-performance design, such as a microprocessor or cell phone chip. This new work in this application provides better design automation, because the linear programming method for DFT hardware insertion allows performance-critical nets in the circuit to be weighted, so that the linear program will never put DFT hardware on those nets, but instead the hardware is driven off of the nets onto other sites that can tolerate the added delay of DFT hardware. Also, this new method avoids excessive DFT hardware insertion, because the placement of DFT hardware is driven by probability and entropy measures of information flow (from information theory). This is a theoretically correct and accurate metric for determining which parts of the circuit need the DFT hardware. Thus, nets that have been critically engineered for highest performance will not be slowed by the addition of test hardware. This is critically important in file server and microprocessor designs, where it is customary to use partial-scan for DFT to avoid added delay on the machine data path. Therefore, we abandon the focus of the prior work on selecting the minimal number of flip-flops, and instead focus on maximizing the fault coverage, and minimizing TV and TAT. This means that we will compare our results for this work to mpscan, as described in D. Xiang and J. Patel, "Partial Scan Design Based on Circuit State Information and Functional Analysis," IEEE Trans. on Computers, 53(3): 276-287, March, 2004, the best of the prior DFT algorithms. We refer to mpscan frequently below. We propose three rather different DFT algorithms.

SPARTAN Spectral and Entropy DFT Insertion Algorithm

We propose a spectral partial-scan algorithm, SPARTAN, as described in O. I. Khan, M. L. Bushnell, S. K. Devanathan, and V. D. Agrawal, "SPARTAN: A Spectral and Information Theoretic Approach to Partial Scan," Proc. of the Int'l. Test Conf., pp 21.1.1-21.1.10, October, 2007 and O. Khan and M. L. Bushnell, "SPARTAN: A Spectral and Information Theoretic Approach to Partial Scan," Proc. of the 16th North Atlantic Test Workshop, pp 19-25, May, 2007. Spectral sequential ATPG tools have attained the highest fault coverages on sequential benchmark circuits, with drastically shorter test sequences in drastically less CPU time than deterministic sequential ATPG tools. SPARTAN uses spectral analysis and entropy analysis for scan flip-flop (SFF) selection by logic simulation with an analysis of the CUT structure. SPARTAN's results are compared to Xiang and Patel's partial-scan algorithm, mpscan, because mpscan has higher FC and shorter test vector length (TL) compared to prior partial-scan algorithms that use only structural information and testability analysis. In fact, the resulting ATPG fault coverage was not reported for most prior partial-scan methods. SPARTAN achieved a higher FC (an average of 97.6%) compared to mpscan (an average of 96.7%). The average TV achieved by SPARTAN is 349 Kbits and the average TAT is 327971 clock cycles.

The algorithm analyzes the CUT and selects SFFs using three measures: spectral analysis of the flip-flop oscillations, entropy from information theory, and logic gate circuit level information to measure observability and controllability. A high quality SFF set will enhance the testability of the CUT, which allows the ATPG method to attain high fault coverage with a shorter test set. We use the spectral analysis and entropy combination because spectral analysis incorporates only functional information and does not use any structural information of the CUT.

1.1 Test Points and Scan Flip-Flops

FIGS. 2, 3, 4, and 5 show typical test points and scan flip-flops. However, the method of this application may operate with any arbitrary test point or scan flip-flop design.

1.2 Spectral Analysis 1.2.1 Data Structure

SPARTAN uses an s-graph, the logic circuit graph, and logic simulation. In a sequential circuit, each s-graph node represents a flip-flop and an edge between two nodes is a path through combinational logic between the flip-flops. When the s-graph is condensed, each node of a condensed s-graph is called a strongly-connected component (SCC).

1.2.2 Spectral Algorithm

Overview. Because of the success of spectral ATPGs, we propose to dissect the function and structure of sequential circuit states in the spectral domain. The spectral coefficients (SCs) for each flip-flop in the CUT, which are coefficients of the flip-flop frequencies in the frequency domain, are used as a controllability measure. A low toggling rate flip-flop will have small SC values and thus is difficult to control. If the average value of the SCs of a flip-flop is low (low toggling), the flip-flop has low controllability and will be a good SFF candidate (see Example 3). A low toggling flip-flop has bad controllability because regardless of which vectors are used, the ATPG will have to apply many vectors to set the flip-flop to a desired state in order to observe or sensitize faults. To compute observability, we first find for each flip-flop the primary outputs (POs) in its fanout cone. We then compute the SCs of all POs. Then we perform a SC comparison of each flip-flop with each PO in its fanout cone. If the SCs of a flip-flop are identical to SCs of any one of POs in its fanout cone, we consider that flip-flop observable. We employ an order 4 Radamacher-Walsh transform (RWT) (an order 3 RWT is shown in Equation 9) for analyzing states of flip-flops and POs. First, the state machine is initialized to a randomly-chosen state. Flip-flop states and PO logic values are obtained via logic simulation with 50K random vectors, as described by S. L. Hurst, D. M. Miller, and J. C. Muzio, "Spectral Techniques in Digital Logic," Academic Press Inc., 1985, London.

Spectral Correlation Coefficients. The spectral correlation coefficients, for each flip-flop, are obtained by dividing the flip-flop state over the last n clock periods into chunks (the state vector is divided into smaller column vectors), Z, and pre-multiplying each chunk with the RWT of appropriate dimension (see Equation 9). S is the SC vector. The chunk size for the flip-flop states depends on the dimension of the RWT used. We use a 16×16 matrix for our analysis. Matrix dimensions up to 512×512 were tried, but larger matrices had inconsequential effect on the quality of the SFF set. Also, it takes less CPU time to perform spectral analysis using a 16×16 transform. Since the transform entries $\in \{+1, -1\}$, we have to translate the flip-flop states to +1 or -1. We translate $0 \rightarrow -1$ and $1 \rightarrow +1$ because when we calculate the spectral coefficients (a SC is the number of agreements minus the number of disagreements with the row elements of the transform matrix), logic 0 and logic 1 should be given equal and opposite magnitude. This ensures that both logic 0 and logic 1 are weighted equally and provide a contribution in the SCs. For example, if we have a vector with logic 0's and logic 1's and if we extract spectra (using any matrix transform) from this vector, the logic 0's in the vector will have no contribution in the SCs. FIG. 6 shows the wave representation of the order 3 (8×8) RWT. When a bit stream is analyzed using an order 3 transform, each coefficient tells us how well the bit stream correlates with each wave in FIG. 6 (or matrix row in Equation 9).

$$RWT(3) = \begin{bmatrix} 1 & 1 & 1 & 1 & 1 & 1 & 1 & 1 \\ 1 & 1 & 1 & 1 & -1 & -1 & -1 & -1 \\ 1 & 1 & -1 & -1 & 1 & 1 & -1 & -1 \\ 1 & -1 & 1 & -1 & 1 & -1 & 1 & -1 \\ 1 & 1 & -1 & -1 & -1 & -1 & 1 & 1 \\ 1 & -1 & 1 & -1 & -1 & 1 & -1 & 1 \\ 1 & -1 & -1 & 1 & 1 & -1 & -1 & 1 \\ 1 & -1 & -1 & 1 & -1 & 1 & 1 & -1 \end{bmatrix} \quad (9)$$

$$RWT(3) \times [Z] = [S]$$

Example 2

In this example we will use the 8×8 RWT for analysis. To compute the first SC ($s_0$), row 1 of the 8×8 RWT is first multiplied with column vector Z, comprised of the flip-flop state over the last 8 clock periods, to obtain the SC with the first 8 states of the flip-flop. This 8 bits of state is then multiplied by rows 2 through 8 of RWT (3) to obtain the remaining 7 SCs, $s_1$-$s_7$, with the RWT basis vectors. RWT (3) is then multiplied with bits 2 to 9, bits 3 to 10, and so on of the flip-flop states. The partial SCs of the flip-flop obtained, after each row of the RWT is multiplied with the state over the last 8 clock periods, are aggregated and normalized by the number of times multiplication was performed by row 1 to obtain the first SC $s_0$. Example 3 elaborates the spectral analysis procedure. Multiplication of a row with a chunk Z is the calculation of the correlation of the data vector with that matrix row. Here the data vectors are the first row of the RWT and a state chunk Z.

Example 3

We use the RWT in Equation 9 for spectral analysis of a flip-flop F. After ten random vectors at primary inputs (PIs) of the CUT, F goes through states V=[1,0,1,1,0,1,1,0,0,0]. After translation, we get V'=[1,−1,1,1,−1,1,1,−1,−1,−1]. To compute $s_0$, we multiply row 1 of the RWT with translated bits 1-8, 2-9, and 3-10 of V'. For bits 1-8 the partial SC is (1×1)+(1×−1)+(1×1)+(1×1)+(1×−1)+(1×1)+(1×1)+(1×−1)=2. For bits 2-9 the partial SC is (1×−1)+(1×1)+(1×1)+(1×−1)+(1×1)+(1×1)+(1×−1)+(1×−1)=0 and bits 3-10 give us (1×1)+(1×1)+(1×−1)+(1×1)+(1×1)+(1×−1)+(1×−1)+(1×−1)=0. The aggregate of partial sums is 2+0+0=2 and after normalization we get $s_0$=⅔. Normalization is by 3 because there were 3 multiplication operations of row 1 and three 8-bit chunks (Z) of V'. This flip-flop will have 8 SCs. Similarly, SCs are computed for other flip-flops.

Procedure 1 shows the spectral analysis and FIG. 7 presents the flow chart of the spectral analysis. Please note that spectral correlation coefficient and SC will be used interchangeably.

---
Procedure 1 -- Spestral Analysis (see FIG. 7):
---

1. Logic simulate the CUT with the warmup count (50K) if on the first simulation, or the iteration count (512) if on a later iteration, of random vectors to obtain valid FF states and PO values. (Block 10)
2. Compute SCs of all FFs and POs and set GOOD_Observability = FALSE for all FFs. (Block 20)
3. Set $SC_{avg\_MAX} = 0$ and $SC_{avg\_MIN} = 0$.
4. For each flip-flop:
   a. Compute the average of SCs, $SC_{i\_avg}$, for flip-flop i with k = 16 using Equation 10. (Block 30) The sequency, $\phi_j$, which is analogous to frequency, of a row is the number of 1 → −1 and −1 → 1 transitions in the row. For example, in Equation 9, the sequency of the first matrix row is zero, the sequency of the second row is one, and so on. In Equation 10, $w_j$ is a normalizing coefficient and it assigns lower weights to the low sequency FFs and higher weights to the high sequency FFs, which directlycorrelates to the controllability of the FF.
   b. If $SC_{i\_avg} \geq SC_{avg\_MAX} \Rightarrow SC_{avg\_MAX} = SC_{i\_avg}$.
   c. If $SC_{i\_avg} \leq SC_{avg\_MIN} \Rightarrow SC_{avg\_MIN} = SC_{i\_avg}$.
   d. Compare SCs of FF i with SCs of POs in its fanout cone. (Block 50)
      i. If SCs of FF i == SCs of any fanout cone PO ⇒ Good_Observability (i) = TRUE. (Blocks 55 and 60)

---
Procedure 1 -- Spestral Analysis (see FIG. 7):
---

5. Compute the SC Threshold using Equation 11.
6. For each flip-flop: (Block 35)
   a. IF $SC_{i\_avg}$ < SC Threshold && Good_Observability (i) == FALSE ⇒ scan_mark (FF (i)) = TRUE. (Blocks 45 and 65)

$$SC_{i\_avg} = \frac{\sum_{j=1}^{k} w_j |SC_j|}{k} \quad (10)$$

$$w_j = \frac{(\varphi_j + 1)}{\sum_{h=1}^{k} (\varphi_h + 1)} \quad (11)$$

SC Threshold = average($SC_{avg\_MIN} + SC_{avg\_MAX}$)

After Procedure 1 (FIG. 7), spectral analysis gives a list of candidate flip-flops recommended for scanning. We will scan only a subset of this list. If a flip-flop only has paths to it from other flip-flops, we automatically scan it. Next, we set the scanning threshold (ST) to 25% of the total FFs in the circuit. This gives us the size of the subset (of the initial candidate FF list from Procedure 1) that will eventually be scanned. ST can be varied and 25% gave the best results. Once ST is set, we start scanning FFs from the list of FFs marked as candidates for scanning by Procedure 1, starting with FFs belonging to the largest SCC because it will help us break bigger cycles in the circuit. Once all of the marked FFs in a SCC are scanned, the SCC is marked as 'visited' and cannot be revisited. If the number of scanned FFs is less than ST, we move to subsequent SCCs of the circuit. The procedure is Procedure 1a (see FIG. 8).

---
Procedure 1a -- SFF Selection After Spectral Analysis:
---

1. Number of SFFs, numScanFF = 0. (Block 100)
2. Largest SCC size, maxSCCSz = 0.
3. Each SCC's scan flag is cleared, SCC (i)_scanned = FALSE. (Block 105)
4. while numScanFF < ST
   a. for each SCC i: /*Locate largest SCC not visited yet.*/ (Block 115)
      i. if SCC (i)_scanned == FALSE
         A. if SCC (i)_size > maxSCCSz ⇒ maxSCCSz = SCC (i)_size and SCC_max = SCC (i).
   b. for each flip-flop, FF (i), in C_max: (Blocks 120 and 125)
      i. if (scan_mark (FF (i)) == TRUE) (Block 130)
         A. scan (FF (i)) = TRUE and numScanFF ++. (Block 135)
         B. if numScanFF > ST ⇒ break for-loop (Step 4b). (Block 140)
   c. SCC (i)_scanned = TRUE. (Block 110)

FIGS. 9 and 10 show the spectral and entropy analysis procedures for TP insertion.

1.2.3 Computational Complexity

Complexity of Procedure 1. Assume that the CUT has N logic gates, L lines, F flip-flops, P POs, and $P_{FO}$ POs in a flip-flop's fanout cone. Also, the CUT is logic simulated using V vectors. To find SCCs, we need to perform depth-first search (DFS) on the s-graph. The complexity if DFS is O (N+L). The complexity of Step 1 is O (V N). Step 2 has a cost of O ((F+P)×(V−(16−1))×256). The loop in Step 4 compares each flip-flop's SCs with SCs of all POs in its fanout cone.

Since there are 16 coefficients for each PO and $P_{FO}$ POs in each flip-flop's fanout cone, we get a total complexity of O $(F \times (16 \times P_{FO}))$. The complexity of the Step 6 loop is O (F). Steps 3 and 5 use constant time. So, the total computational complexity of Procedure 1 is approximately O ((N+E)+VN+ (F+P)V+F×$P_{FO}$).

Complexity of Procedure 1a. Assume that there are S SCCs in the circuit, $F_{SCC}$ flip-flops in each SCC, and ST is the scan threshold. The Step 4 loop's complexity in Procedure 1a is O (ST (S+$F_{SCC}$)).

1.3 Entropy Analysis

Agrawal's Work. Agrawal showed that the testability of a circuit can be improved by increasing entropy at the POs (see above). SPARTAN uses entropy H as a testability measure to select scan flip-flops such that the entropy of unscanned flip-flops in the CUT is enhanced. Increasing the entropy of a line l in the circuit is akin to increasing the controllability of l. FIG. 1 shows that entropy is maximum when logic 0 and logic 1 are equally likely, i.e., the probabilities of logic 0 (p (0)) and logic 1 (p (1)) occurring are equal (p (0)=p (1)=0.5). Then, controlling l to 0 or 1 from primary inputs (PIs) should become easier, thus increasing l's controllability. The entropy analysis uses random-pattern testability analysis, as described in K. Parker and E. J. McCluskey, "Probabilistic Treatment of General Combinational Networks," IEEE Trans. on Computers, 24 (1): 668-670, June, 1975, since p (1) and p (0) are required to compute entropy.

Cycle Breaking. Breaking cycles in the s-graph of the CUT improves testability, as described in S. T. Chakradhar, A. Balakrishnan, and V. D. Agrawal, "An Exact Algorithm for Selecting Partial Scan Flip-Flops," Proc. of the 31st Design Automation Conf., pp 81-86, June, 1994; G. S. Saund, M. S. Hsiao, and J. Patel, "Partial Scan Beyond Cycle Cutting," Proc. of the IEEE Int'l. Symp. on Fault-Tolerant Computing, pp 320-328, 1997; D. Xiang and J. Patel, "A Global Partial Scan Design Algorithm Using State Information," Proc. of the IEEE Int'l. Test Conf., pp 548-557, October, 1996; and K.-T. Cheng and V. D. Agrawal, "A Partial Scan Method for Sequential Circuits with Feedback," IEEE Trans. on Computers, 39(4): 544-548, April, 1990. Entropy analysis uses the SCC information for selecting the best scan candidates because SCCs capture direct and indirect paths from a flip-flop to every other flip-flop in the same SCC. Each flip-flop in a SCC lies on at least one cycle. Flip-flops from different SCCs cannot lie on any cycle together because if these two flip-flops were reachable from each other, they would be included in the same SCC and not different SCCs. Therefore, we perform entropy analysis on one SCC at a time in an effort to break cycles (since flip-flops from two distinct SCCs cannot be in any cycle together) in all the SCCs and improve the CUT's testability.

Probability Calculation. We use logic simulation to compute the probabilities, which are then used to compute flip-flop entropies. Parker and McCluskey's probability expressions (PMEs) to compute probabilities can also be used (see Parker and McCluskey above). Even though PMEs provide a quick method for approximating probability values, we used probability values obtained via logic simulations because they are more accurate. Table 1 shows the probability and entropy values, of benchmark s820, for the deterministic method (PME) and for logic simulation. The first column is the flip-flop number, the second is the probability, $p_{sim}$ (1), of a logic 1 obtained via logic simulation, and the third is the corresponding entropy value $H_{sim}$. Similarly, the fourth column is the probability, $p_{det}$ (1), of a logic 1 obtained using PMEs (see Parker and McCluskey above), and the fifth column is the corresponding entropy value $H_{det}$. The sixth column is the difference in entropy values for the two methods. Entropy values for the two methods are not identical because PMEs assume that each line in the CUT is independent, which is not accurate. Since logic simulation accounts for correlation among signal lines in the CUT, probability values obtained via logic simulation are more accurate.

TABLE 1

Experimental and deterministic values for probability of logic 1 (p (1)) and entropy (H) for s820.

| DFF | Simulation | | Deterministic | | % Entropy Difference |
|---|---|---|---|---|---|
| | $p_{sim}$(1) | $H_{sim}$ | $p_{det}$(1) | $H_{det}$ | |
| 1 | 0.329 | 0.914 | 0.272 | 0.844 | 7.66 |
| 2 | 0.036 | 0.222 | 0.019 | 0.136 | 38.74 |
| 3 | 0.037 | 0.227 | 0.046 | 0.267 | 17.62 |
| 4 | 0.044 | 0.260 | 0.076 | 0.387 | 48.85 |
| 5 | 0.137 | 0.576 | 0.106 | 0.487 | 15.45 |
| Ave. | | 0.440 | | 0.424 | 25.66 |

Entropy for Scan Flip-Flop Selection. First, we initialize the state machine to a random state, and we logic simulate it using 50,000 random vectors to compute the probabilities. After all of the probabilities are computed, they are used to compute the entropy, $H_i(Q)$, using Equation 2 and conditional entropies, $H_i(D|PI_j)$, and $H_i(Q|PO_k)$, using Equation 3 for each flip-flop i. $H_i(Q)$ is the information at flip-flop i. $H_i(D|PI_j)$ is the information (controllability) on flip-flop i's input given a logic value (0 or 1) on the $j^{th}$ PI, $PI_j$, in its fanin cone. Similarly, $H_i(Q|PO_k)$ is the amount of information (observability) on flip-flop i's output given a logic value on the $k^{th}$ PO, $PO_k$, in its fanout cone. The number of controllability values ($H_i(D|PI)$) for flip-flop i depends on the number of PIs in its fanin and the number of observability values ($H_i(Q|PO)$) depends on the number of POs in its fanout. Then, for each flip-flop i, we compute the average controllability and observability values using Equations 12 and 13, where p (q) is the number of PIs (POs) in the fanin (fanout) cone of flip-flop i. We maximize the information flow through the circuit and unscanned flip-flops. Increasing the information flow in the circuit is analogous to increasing the testability.

$$H_{i\_avg}(D \mid PI) = \frac{\sum_{x=1}^{p} H_i(D \mid PI_x)}{p} \quad (12)$$

$$H_{i\_avg}(Q \mid PO) = \frac{\sum_{x=1}^{q} H_i(Q \mid PO_x)}{q} \quad (13)$$

So far we have $H_i(Q)$, $H_{i\_avg}(D|PI)$, and $H_{i\_avg}(Q|PO)$ values for each flip-flop i. Now we need average values $H(Q)_j$, $H(D|PI)_j$, and $H(Q|PO)_j$ for any $SCC_j$. Equations 14, 15, and 16 compute the average entropy values for any $SCC_j$ where m is the number of nodes in $SCC_j$.

$$H(Q)_j = \frac{\sum_{i=1}^{m} H_i(Q)}{b} \quad (14)$$

$$H(D\mid PI)_j = \frac{\sum_{i=1}^{m} H_{i\_avg}(D\mid PI)}{m} \quad (15)$$

$$H(Q\mid PO)_j = \frac{\sum_{i=1}^{m} H_{i\_avg}(Q\mid PO)}{m} \quad (16)$$

Similarly, the other SCCs' average entropies are computed. For each SCC (of size >1), the algorithm checks to see which flip-flops in the SCC, if scanned, will cause an increase in the average entropy values of the SCC. It does so by making the flip-flop's input a pseudo primary output (PPO) and its output a pseudo primary input (PPI). It then performs logic simulation to recompute the probabilities of the circuit. This flip-flop is marked as 'tried.' Initially all flip-flops are marked as 'not tried.' Since any flip-flop in a SCC has a direct or indirect path to every other flip-flop in that SCC, scanning a flip-flop will affect the probabilities of all of the unscanned flip-flops in that SCC and possibly other SCCs. This means that scanning a flip-flop in $SCC_j$ will change the entropies of the unscanned flip-flops and thus the average entropy of the $SCC_j$ will change. The new average entropy values of $SCC_j$ become $H(Q)'_j$, $H(D\mid PI)'_j$, and $H(Q\mid PO)'_j$. The changes in average entropy values are given in Equations 17, 18, and 19.

$$\Delta H(Q)_j = H(Q)'_j - H(Q)_j \quad (17)$$

$$\Delta H(D\mid PI)_j = H(D\mid PI)'_j - H(D\mid PI)_j \quad (18)$$

$$\Delta H(Q\mid PO)_j = H(Q\mid PO)'_j - H(Q\mid PO)_j \quad (19)$$

If any one of the average entropy values ($H(Q)'_j$, $H(D\mid PI)'_j$ and $H(Q\mid PO)'_j$) of $SCC_j$, after selecting the flip-flop (currently being considered for scanning), increases at all, the flip-flop is marked as a good candidate for scanning because it increased the controllability and observability of other flip-flops in the SCC. The remaining flip-flops in the SCC are then 'tried' for scanning, one at a time, and the ones that increase the average entropy values of the SCC are marked as good choices for scanning. After all of the flip-flops have been tried for scanning, the flip-flops that were marked for scanning are scanned (and converted into PPIs and PPOs. Procedure 2 is the entropy analysis algorithm (see the flow chart in FIG. 11).

1.3.1 Computational Complexity

Computational Complexity of Procedure 2. Assume that there are N logic gates, F flip-flops, and S SCCs in the CUT. Each SCC has $F_{SCC}$ flip-flops and the CUT is logic simulated with V vectors. The complexity of Step 1 is O (V N), and of Step 2 is O (F). For each SCC, Step 3 calculates the average entropy in Step 3*a*, tries each flip-flop as a scan candidate in Step 3A*ia*, and logic simulates (to compute updated probability values) in Step 3A*ib*. The complexity for average calculation is O ($F_{SCC}$) and the complexity of trying each flip-flop and logic simulating after each try is O ($F_{SCC}$ (V N)). So, the total complexity of Step 3 is O ($S(F_{SCC}(V N+1))$). The total complexity of Procedure 2 is approximately O (V N(S $F_{SCC}$+ 1)).

1.4 Combined Spectral and Entropy Analysis

Note that entropy analysis is applied to SCCs with cardinality >1 and spectral analysis is done on all flip-flops. SPARTAN first performs the spectral analysis and then the entropy analysis. A flip-flop is selected for scan if it is picked by both the spectral and the entropy analysis, and if it is more than 4 levels away from a PI and more than 4 levels away from a PO. FIG. 12 shows SPARTAN's flow chart and Algorithm 1 is the algorithm.

---

Algorithm 1 - The SPARTAN Algorithm.

Input: Circuit netlist (Block 300)
Output: Modified circuit netlist with scan flip-flops
SPARTAN (CIRCUIT)
{
    1. Construct the s-graph from netlist; (Block 305)
    2. Condense s-graph to obtain SCCs; (Block 305)
    3. Perform logic simulation with 50K random vectors;
    4. Perform spectral analysis via Procedures 1 and 1a in Section 1.2.2 to obtain SCs for all flip-flops; (Block 310)
    5. Select spectral analysis based scan flip-flops; (Block 310)
    6. Perform entropy analysis via Procedure 2 in Section 1.3 to obtain entropy for all flip-flops; (Block 315)
    7. Select entropy analysis based scan flip-flops; (Block 315)
    8. Flip-flops selected by both methods are scanned; (Block 320)
    9. If more scanning is required, go to Step 3. Else, exit. (Block 330)
}

---

1.5. Results

We first evaluated whether spectral analysis was sufficient for partial-scan insertion. Table 2 shows results for partial scanning using only spectral analysis. We simulated 50,000

---

Procedure 2 -- Entropy Analysis:

1. Logic simulate to compute values of p (0) and p (1) for all flip-flops. (Block 205)
2. For each flip-flop f: (Block 210)
    A. Use $p_f(0)$ and $p_f(1)$ to calculate entropy values $H_f(Q)$, $H_{f\_avg}(D\mid PI)$, and $H_{f\_avg}(Q\mid PO)$.
3. For each SCC S: (Block 215)
    A. Calculate average entropy values of SCC using Equations 14, 15, and 16.
      i. For each unscanned and 'not tried' flip-flop f in the current SCC: (Block 225)
        a. Try scanning f (mark it 'tried') by converting its input (output) into a PPO (PPI). Perform logic simulation and compute new probabilities. (Block 230)
        b. Backup S's original average entropy values H (Q)s, H (D | PI)S, and H (Q | PO)s. Then compute S's new average entropy values H (Q)'s, H (D | PI)'s, and H (Q | PO)'s from updated probability values. (Block 240)
        c. If $\left( \frac{H(Q)'s - H(Q)s}{H(Q\mid PO)s} > 0.0 \;\middle\|\; \frac{H(D\mid PI)'s - H(D\mid PI)s}{H(D\mid PI)s} > 0.0 \;\middle\|\; \frac{H(Q\mid PO)'s - H(Q\mid PO)s}{H(Q\mid PO)s} > 0.0 \right)$ by scanning f, 'flag' f as a candidate for scanning (Block 240)
      ii. If the number of 'flagged' flip-flops is = 0: (Block 245)
        a. No scan flip-flop is chosen from the SCC S (Block 245) -- try the remaining untried SCCs (Blocks 250 and 220)

random vectors for each circuit, because prior work used that number. The other parameter, ST (scanning threshold), was set to 25% of the flip-flops, which gave the best results, on average. The best result (test efficiency (TE), test length (TL), TV, and TAT) for each benchmark is shown in bold in each table. We compare our results to the mpscan results, as they had the highest fault coverage of any partial-scan method previously reported. HITEC is used to generate test patterns for all three tables discussed below. The best results are highlighted in bold.

TABLE 2

ISCAS-89 benchmark results for spectral analysis only compared to mpscan.

| | SPARTAN | | | | | | mpscan | | | |
|---|---|---|---|---|---|---|---|---|---|---|
| Ckt. | SFF | TE (%) | TL | TV (bits) | TAT (cycles) | CPU Time (s) | SFF | TE (%) | TL | TV (bits) | TAT (cycles) |
| s298 | 4 | 100.00 | 161 | 1127 | 644 | 4 | 2 | 100.0 | 160 | 800 | 320 |
| s344 | 7 | 100.00 | 75 | 1200 | 525 | 7 | 3 | 100.0 | 141 | 1692 | 423 |
| s349 | 7 | 100.00 | 52 | 832 | 364 | 4 | 3 | 100.0 | 161 | 1932 | 483 |
| s382 | 13 | 100.00 | 108 | 1728 | 1404 | 17 | 6 | 100.0 | 168 | 1512 | 1008 |
| s386 | 4 | 100.00 | 217 | 2387 | 868 | 9 | 4 | 100.0 | 205 | 2255 | 820 |
| s400 | 10 | 100.00 | 113 | 1582 | 1130 | 9 | 4 | 100.0 | 394 | 3152 | 1576 |
| s444 | 13 | 100.00 | 92 | 1472 | 1196 | 11 | 6 | 100.0 | 193 | 1737 | 1158 |
| s526 | 15 | 100.00 | 182 | 3276 | 2730 | 23 | 10 | 100.0 | 273 | 3549 | 2730 |
| s641 | 12 | 100.00 | 147 | 6909 | 1764 | 19 | 1 | 100.0 | 286 | 5720 | 286 |
| s713 | 9 | 100.00 | 186 | 8184 | 1674 | 13 | 1 | 100.0 | 310 | 11160 | 310 |
| s820 | 2 | 100.00 | 679 | 13580 | 1358 | 6 | 2 | 100.0 | 602 | 12040 | 1204 |
| s953 | 6 | 100.00 | 252 | 5544 | 1512 | 19 | 3 | 100.0 | 339 | 6441 | 1017 |
| s1423 | 58 | 99.70 | 246 | 18450 | 14268 | 276 | 41 | 99.7 | 397 | 23026 | 16277 |
| s1488 | 4 | 100.00 | 406 | 4872 | 1624 | 23 | 2 | 100.0 | 639 | 6390 | 1278 |
| s1494 | 4 | 100.00 | 391 | 4692 | 1564 | 22 | 2 | 100.0 | 622 | 6220 | 1244 |
| s5378 | 79 | 99.90 | 1100 | 125400 | 86900 | 123 | 50 | 100.0 | 1023 | 86955 | 51150 |
| s9234 | 177 | 98.70 | 1332 | 261072 | 235764 | 33480 | 97 | 98.6 | 3114 | 361224 | 302058 |
| s13207 | 336 | 98.40 | 7452 | 2734884 | 2503872 | 6390 | 58 | 95.8 | 9805 | 872645 | 568690 |
| s15850 | 365 | 99.00 | 3402 | 1503684 | 1241730 | 46140 | 180 | 99.9 | 4527 | 1163439 | 814860 |
| s35932 | 433 | 99.99 | 456 | 213408 | 197448 | 1617 | 150 | 100.0 | 252 | 46620 | 37800 |
| s38417 | 946 | 96.50 | 5393 | 5252782 | 5101778 | 5040 | 400 | 96.0 | 11573 | 4953244 | 4629200 |
| s38584 | 651 | 94.80 | 7568 | 5017584 | 4926768 | 31615 | | | | | |
| Ave. w/o s38584 | | 99.60 | 1069 | 484146 | 447625 | 4441 | | 99.5 | 1675 | 360560 | 306376 |

TABLE 3

ISCAS-89 benchmark results for SPARTAN (spectral with entropy) compared to mpscan.

| | SPARTAN | | | | | | mpscan | | | |
|---|---|---|---|---|---|---|---|---|---|---|
| Ckt. | SFF | TE (%) | TL | TV (bits) | TAT (cycles) | CPU Time (s) | SFF | TE (%) | TL | TV (bits) | TAT (cycles) |
| s298 | 11 | 100.00 | 93 | 1302 | 1023 | 27 | 2 | 100.0 | 160 | 800 | 320 |
| s344 | 7 | 100.00 | 75 | 1200 | 525 | 55 | 3 | 100.0 | 141 | 1692 | 423 |
| s349 | 8 | 100.00 | 35 | 595 | 280 | 57 | 3 | 100.0 | 161 | 1932 | 483 |
| s382 | 17 | 100.00 | 142 | 2840 | 2414 | 59 | 6 | 100.0 | 168 | 1512 | 1008 |
| s386 | 4 | 100.00 | 217 | 2387 | 868 | 11 | 4 | 100.0 | 205 | 2255 | 820 |
| s400 | 16 | 100.00 | 109 | 2180 | 1744 | 19 | 4 | 100.0 | 394 | 3152 | 1576 |
| s444 | 18 | 100.00 | 171 | 3591 | 3078 | 43 | 6 | 100.0 | 193 | 1737 | 1158 |
| s526 | 19 | 100.00 | 176 | 3872 | 3344 | 143 | 10 | 100.0 | 273 | 3549 | 2730 |
| s641 | 9 | 100.00 | 235 | 10340 | 2115 | 79 | 1 | 100.0 | 286 | 5720 | 286 |
| s713 | 9 | 100.00 | 231 | 10164 | 2079 | 65 | 1 | 100.0 | 310 | 11160 | 310 |
| s820 | 2 | 100.00 | 679 | 13580 | 1358 | 10 | 2 | 100.0 | 602 | 12040 | 1204 |
| s953 | 23 | 100.00 | 234 | 9126 | 5382 | 127 | 3 | 100.0 | 339 | 6441 | 1017 |
| s1423 | 63 | 99.30 | 227 | 18160 | 14301 | 673 | 41 | 99.7 | 397 | 23026 | 16277 |
| s1488 | 5 | 100.00 | 347 | 4511 | 1735 | 127 | 2 | 100.0 | 639 | 6390 | 1278 |
| s1494 | 4 | 100.00 | 445 | 5340 | 1780 | 124 | 2 | 100.0 | 622 | 6220 | 1244 |
| s5378 | 114 | 99.90 | 1165 | 173585 | 132810 | 2443 | 50 | 100.0 | 1023 | 86955 | 51150 |
| s9234 | 199 | 98.60 | 1231 | 268358 | 244969 | 4658 | 97 | 98.6 | 3114 | 361224 | 302058 |
| s13207 | 496 | 100.00 | 2360 | 1243720 | 1170560 | 8915 | 58 | 95.8 | 9805 | 872645 | 568690 |
| s15850 | 407 | 99.96 | 1980 | 958320 | 805860 | 34075 | 180 | 99.9 | 4527 | 1163439 | 814860 |
| s35932 | 477 | 99.99 | 298 | 152576 | 142146 | 101435 | 150 | 100.0 | 252 | 46620 | 37800 |
| s38417 | 1249 | 96.70 | 3482 | 4446514 | 4349018 | 43670 | 400 | 96.0 | 11573 | 4953244 | 4629200 |
| Ave. | | 99.70 | 663 | 349155 | 327971 | 9372 | | 99.5 | 1675 | 360560 | 306376 |

We added entropy analysis to spectral analysis because the entropy analysis uses structural (SCC) and functional (logic probability) information to select flip-flops. The two analyses together will use both structural and functional analysis to improve the quality of the scan set. Table 3 shows results with SPARTAN using a combination of spectral and entropy analysis to select scan flip-flops for ISCAS-89 benchmarks. Column 2 gives the number of SFFs, column 3 is the test vectors, but also slightly improved the TE. In Table 4, on average, SPARTAN's TV is 25.6% lower than mpscan and TAT is 22.2% shorter than for mpscan. Although data and control lines have different testability requirements, we have no information about which lines are data vs. control in the ISCAS '89 circuits, so we treat both kinds of lines identically. Also, this partial-scan method can support multiple scan chains.

TABLE 4

ISCAS-89 benchmark results for SPARTAN (spectral and entropy) after compaction of HITEC vectors compared to mpscan.

| | SPARTAN | | | | | mpscan | | | | |
|---|---|---|---|---|---|---|---|---|---|---|
| Ckt. | SFF | TE (%) | TL | TV (bits) | TAT (cycles) | CPU Time (s) | SFF | TE (%) | TL | TV (bits) | TAT (cycles) |
| s298 | 11 | 99.70 | 69 | 966 | 759 | 1 | 2 | 98.7 | 160 | 800 | 320 |
| s344 | 7 | 99.70 | 70 | 1120 | 490 | 1 | 3 | 99.4 | 141 | 1692 | 423 |
| s349 | 8 | 99.10 | 35 | 595 | 280 | 1 | 3 | 98.9 | 161 | 1932 | 483 |
| s382 | 17 | 99.00 | 139 | 2780 | 2363 | 1 | 6 | 99.0 | 168 | 1512 | 1008 |
| s386 | 4 | 100.00 | 156 | 1716 | 624 | 1 | 4 | 100.00 | 205 | 2255 | 820 |
| s400 | 16 | 94.60 | 109 | 1880 | 1504 | 9 | 4 | 95.8 | 394 | 3152 | 1576 |
| s444 | 18 | 96.80 | 129 | 2709 | 2322 | 1 | 6 | 96.2 | 193 | 1737 | 1158 |
| s526 | 19 | 99.80 | 120 | 2640 | 2280 | 1 | 10 | 99.3 | 273 | 3549 | 2730 |
| s641 | 9 | 99.40 | 128 | 5632 | 1152 | 1 | 1 | 99.4 | 286 | 5720 | 286 |
| s713 | 9 | 92.90 | 144 | 6336 | 1296 | 1 | 1 | 92.9 | 310 | 11160 | 310 |
| s820 | 2 | 100.00 | 452 | 9040 | 904 | 3 | 2 | 100.0 | 602 | 12040 | 1204 |
| s953 | 23 | 100.00 | 145 | 5655 | 3335 | 1 | 3 | 100.0 | 339 | 6441 | 1017 |
| s1423 | 63 | 98.50 | 154 | 12320 | 9702 | 9 | 41 | 98.1 | 397 | 23026 | 16277 |
| s1488 | 5 | 100.00 | 249 | 3237 | 1245 | 7 | 2 | 100.0 | 639 | 6390 | 1278 |
| s1494 | 4 | 99.20 | 324 | 3888 | 1296 | 11 | 2 | 99.1 | 622 | 6220 | 1244 |
| s5378 | 114 | 98.96 | 822 | 122478 | 93708 | 68 | 50 | 97.2 | 1023 | 86955 | 51150 |
| s9234 | 199 | 93.40 | 958 | 208844 | 190642 | 122 | 97 | 93.0 | 3114 | 361224 | 302058 |
| s13207 | 496 | 98.10 | 1823 | 960721 | 904208 | 732 | 58 | 85.6 | 9805 | 872645 | 568690 |
| s15850 | 407 | 95.10 | 1383 | 669372 | 562881 | 722 | 180 | 94.8 | 4527 | 1163439 | 814860 |
| s35932 | 477 | 89.80 | 165 | 84480 | 78705 | 143 | 150 | 89.8 | 252 | 46620 | 37800 |
| s38417 | 1249 | 96.40 | 2885 | 3684145 | 3603365 | 3004 | 400 | 94.5 | 11573 | 4953244 | 4629200 |
| Avg. | | 97.60 | 498 | 275741 | 260146 | 230 | | 96.7 | 1675 | 360560 | 306376 | efficiency (TE) or fault efficiency, column 4 is the TL, column 5 is the test data volume (TV), and column 6 is the test application time (TAT) for SPARTAN.

$$TV = \text{\# of test vectors} \times (\text{\# PIs} + \text{\# of SFFs}) \quad (20)$$

$$TAT = \text{\# of SFF} \times TL \quad (21)$$

Similarly, columns 8 to 12 of Table 3 report the results for Xiang and Patel's partial-scan algorithm, mpscan. Method mpscan has better results for TAT than SPARTAN for smaller circuits, but SPARTAN gets better results than mpscan as circuit size increases. SPARTAN gets an average of 99.7% TE, while mpscan's average TE is 99.5%. SPARTAN's average TV is 349155 bits, whereas mpscan's average TV is 360560 bits. The TAT is the number of clock cycles required to shift data into the scan chain (see Equation 21). SPARTAN's average TAT is 327971 cycles and mpscan attained 306376 cycles. SPARTAN's average TAT is 6.58% longer than mpscan, but SPARTAN has a higher TE and lower TV and TAT than mpscan for the larger benchmarks. For s9234, SPARTAN has 26% lower TV and 19% lower TAT. For s15850, SPARTAN has 18% lower TV and 1.1% lower TAT. For s38417, SPARTAN also has a higher TE and 10% lower TV and 6% lower TAT.

Table 4 shows SPARTAN results after compaction was applied to the HITEC vectors generated for the circuit with DFT using the spectral ATPG compactor (see Devanathan and Bushnell above). This not only greatly compacted the 1.6 Variants of Algorithm Later SPARTAN results (below) are reported for three variations of the SPARTAN algorithms: partial-scan insertion only (PS), partial-scan with test point inserter 1 (TPI1), and partial-scan with test point inserter 2 (TPI2).

The First Test Point Insertion Algorithm—Algorithm TPI1

Population of Test Point Candidate List C. TPI1 first computes the variable median, which is half of the maximum number of levels in the circuit. The algorithm takes a user specified value, level_range, to find the gates that will be considered as test point candidates, where 0<level_range<1. The level_range specifies the fraction of the number of levels succeeding and preceding the middle of the circuit from which the initial test point candidate lines are to be selected. For example, if the maximum number of levels in the circuit is 10, median will be 5 and if level_range=0.5, then median±⌊0.5×median⌋ will populate C with all the gates between levels 3 and 7. The variable median is used to locate the center of the circuit and test point candidates embedded in the circuit. Test point insertion in or near the center of the circuit is more effective because lines with low testability are usually embedded somewhere in the middle of the circuit. The variable level_range is used to expand the candidate selection from the circuit's center and to give the user the flexibility to choose the size of candidate set C. Ideally, we would want to try each and every line in the circuit, but this approach will be computationally infeasible for a large set C because we have to perform logic simulation each time we try a candidate test point in C.

Once we are done populating the set C, we randomly pick test point candidates from C. A user-specified value for the variable numTPs decides the number of random test point candidates picked from C. This further reduces the size of the candidate set C. The candidate test point lines that are not selected during the random selection are discarded from C.

Spectral and Entropy Analysis. Then TPI1 uses the above spectral analysis (see Section 1.2.2) and entropy analysis (see Section 1.3) procedures on the test point candidate lines in C. After the spectral and entropy analyses are performed, the candidate lines l in C selected by both are marked as good candidates for test point insertion and the rest of the candidate lines in C are discarded.

Observation Primary Input (OPI) Analysis. In this step, for each candidate line l in C, the algorithm locates the primary inputs that need to be specified to observe a fault effect on this line l. FIG. 13 shows a circuit with a logic cone $C_1$, where $C_1$ drives a PO and a logic cone $C_2$, where $C_2$ drives the candidate test point line l. Assume that a set of inputs I has to be specified, to control the logic gates in the shaded areas in FIG. 13, to propagate any fault effect on line/to a PO. If we insert a test point at line l, then none of the inputs in I need to be specified to propagate the fault effects on l. Since adding a test point on l removes the requirement to specify the inputs in I, the test point on l can help reduce ATPG time and may reduce the test set length, especially if the ATPG produces don't cares in the test patterns. The set I is referred to as the observability primary inputs (OPIs) and is stored in OPIs (l) for a line l. The goal here is to select candidate lines with large OPI sets. Therefore, the algorithm first locates the OPIs for all lines in C. The algorithm then compares and locates the number of OPIs of each line in C that overlap with the OPIs of every other line in C. For example, let us consider two candidate lines l and l' with OPI sets I and I'. If the OPI set I' is a subset of OPI set I, then we remove l' from the candidate list, since it is in the neighborhood of l and selecting test points that are close to each other does not cause a significant improvement in the testability of the circuit. Also, since l' is relieving a subset of PIs from being specified by the ATPG, selecting l' will not help reduce the ATPG time or test length. In case the OPI set I' is not a subset of I, but has some overlap with I, the algorithm selects the candidate line with a larger OPI set and computes the amount of overlap between I and I'. If the smaller OPI set contains more than 50% overlap of the larger OPI set, the candidate line with the smaller OPI set is considered to be in the neighborhood of the candidate line with the larger OPI set. Thus, the candidate line with the smaller OPI set is discarded from C.

For two candidate lines l and l' under consideration, we compute the amount of overlap with a simple procedure using a for-loop. A flag, pi_acquired (I), is associated with each PI I in the circuit. We set the flag pi_acquired ($I_{FI}^l$) to TRUE for each PI $I_{FI}^l$ in ls fanin cone. Then we iterate through the PIs in l's fanin cone and if the flag pi_acquired ($I_{FI}^{l'}$) of PI $I_{FI}^{l'}$ in l''s fanin cone is TRUE, it means that this PI is also included in the fanin cone of line l. We count the total number of PIs in the fanin cone of l' that are set to TRUE and this gives the amount of overlap between lines l and l'. The percentage overlap of two candidate lines is computed as the ratio of amount of overlap between the two lines and the total number of PIs in the fanin cone of the larger of the two cones.

After the OPI analysis in the last step, the remaining candidate lines in C are selected for test point insertion. Algorithm I shows TPI1.

---

Algorithm I: The First Test Point Insertion Algorithm -- TPI1.

Input: Scanned version of the circuit netlist.
Output: Modified scanned circuit netlist with test points inserted.
SPARTAN_TPI1 (SCANNED CIRCUIT)
{
   1. Compute median of SCANNED CIRCUIT;
   2. Use level_range to compute range of levels in SCANNED CIRCUIT and populate candidate list C with logic gates within this range of levels;
   3. Randomly select numTPs test point candidates from C;
   4. Perform spectral analysis procedure on C (Section 1.2.2);
   5. Perform entropy analysis procedure on C (Section 1.3);
   6. Keep candidate lines selected by spectral and entropy analyses and the remaining candidate lines are discarded from C;
   7. Perform OPI analysis on remaining candidate list C;
   8. Insert test points on candidate lines remaining in C;
}

---

Computational Complexity of TPI1. Assume that there are N logic gates, $L_{total}$ lines, C test point candidate lines, and P POs. Assume that there are $P_{FO}^l$ POs in a candidate test point line l' s fanout cone in the CUT. Also, the CUT is logic simulated using V vectors. Steps 1 and 2 have a computational cost of O (l). Step 3 is a while-loop and its computational complexity is O (numTPs). Variable numTPs decides the number of test point candidates that will be selected randomly from an initial set of candidate list. The complexity of Step 4 (Section 1.2.3) is O (V N+(C+P)V+C×$P_{FO}^l$). The complexity of Step 5 is (Section 1.3.1) is O (V N(C+1)+C). Step 7 locates OPIs for a candidate line l. This involves a forward depth-first search (DFS) from the candidate line/to POs to locate all of the lines that need to be controlled to propagate the fault effect at line l to be observed at a PO (the off-path lines). Assume that there are $L_{off\text{-}path}^l$ lines for candidate line l. The complexity to locate all off-path lines will be O (N+$L_{total}$). Then a backward DFS is performed for each of the off-path lines to locate all of the PIs that need to specified to control the off-path lines. The complexity will be O ($L_{off\text{-}path}^l$(N+$L_{total}$)). This step has to carried out for each candidate line, so the total complexity of the OPI analysis will be O (C ($L_{off\text{-}path}^l$(N+$L_{total}$))). The total complexity of TPI1 is O ((V N+(C+P)V+C×$P_{FO}^l$+(V N (C+1)+C)+(C($L_{off\text{-}path}^l$(N+$L_{total}$))))). If N≈V, N>>C, $L_{total}$>>C and $L_{total}$>>$L_{off\text{-}path}^l$, the complexity will be O ($N^2$+(C($L_{off\text{-}path}^l$(N+$L_{total}$)))).

The Second Test Point Insertion Algorithm—TPI2

Population of Initial Test Point Candidate List C. This is the same as for algorithm TPI1, but without the random selection of test point candidates from C.

Observation Primary Inputs (OPIs) Analysis. This step is the same as for TPI1, but without the pi_acquired calculation.

Spectral and Entropy Analysis. This is the same as the algorithm used for TPI 1.

After the last step, the candidate lines remaining in C are selected for test point insertion.

---

Algorithm II: The Second Test Point Insertion Algorithm -- TPI2.

Input: Scanned version of the circuit netlist.
Output: Modified scanned circuit netlist with test points inserted.
SPARTAN_TPI2 (SCANNED CIRCUIT)
{
   1. Compute median of SCANNED CIRCUIT;
   2. Use level_range to compute range of levels in SCANNED CIRCUIT and populate candidate list C with logic gates within this range of levels;
   3. Perform OPI analysis;
   4. Perform spectral analysis procedure on C (Section 1.2.2);

Algorithm II: The Second Test Point Insertion Algorithm -- TPI2.

5. Perform entropy analysis procedure on C (Section 1.3);
    6. Keep candidate lines selected by spectral and entropy analyses and the remaining candidate lines are discarded from C;
    7. Insert test points on candidate lines remaining in C;
}

Computational Complexity of TPI2. The computational complexity of TPI2 will be identical to that of TPI1.

2. Linear Programming Formulation

From logic simulation, we calculate p (0) and p (1) for all circuit lines. This is more accurate than using the Parker-McCluskey equations to approximate the signal probabilities, because the equations do not account for signal correlation whereas the logic simulation partially accounts for correlation. We then calculate the entropy (information) on the D lines of all flip-flops, given that the primary inputs (PIs) in its fanin cone are controlled, and the entropy on the Q lines of all flip-flops, given that the primary outputs (POs) in their fanout have logic values. We find average flip-flop entropies for all flops in a strongly-connected component (SCC). An SCC is a sub-graph of the circuit in which any flip-flop can reach any other flip-flop (including itself). For each flop in the SCC, we try to scan it, and recalculate probabilities and entropies for the SCC using logic simulation. The computational complexity of this logic simulation procedure is roughly $O(L^2)$, where L is the number of logic gates, so the number of vectors used for this analysis must be limited. Finally, all flip-flops selected for scan by entropy analysis and that are >4 levels of logic away from PIs and POs are scanned. Similar entropy analysis procedures are used to select combinational nodes for inserting test points.

This algorithm and linear program are designed to let the designer set weights on signals in the circuit. If weight>0, then that signal should not receive testability hardware, in order to avoid slowing down the circuit. The higher the weight, the less likely the linear program is to add test hardware to that signal. The formulation can also be modified to allow the designer to set hard limits on the number of flip-flops to be scanned and the number of test points to be inserted. The final parameter is k, the penalty weight for DFT hardware, which is determined empirically. The higher the k value, the less likely the algorithm is to insert DFT hardware.

The linear program is formulated in terms of parameters, variables, a cost function, and constraints.

Parameters:

L=# of logic gates

F=# of flip-flops nSCCs=# of SCCs in circuit k=DFT objective function weight, $0.95 \leq k \leq 0.99$ Variables:

$X_i$=state of logic gate i (if 1, no test point was inserted, if 0, a test point has been inserted)

$Y_i$=state of flip-flop i (if 1, it was not scanned, if 0, it has been scanned)

$N_i$=integer code assigned to logic gate or flip-flop i (which has $X_i$=0 or $Y_i$=0) by the designer to prevent the algorithm from putting test hardware on gate or flip-flop i. The higher the code, the less likely it is that the LP will put hardware on i.

$E_i$=Entropy of node i $$T = \text{total testability}$$
$$= \sum_i E_i(X_i) + \sum_i E_i(Y_i)$$
$$= \text{sum of entropies of all gates and flops}$$

$$T_P = L - \sum_{i=1}^{L} X_i$$
$$= \text{\# of test points in circuit}$$

$$SF = F - \sum_{i=1}^{F} Y_i$$
$$= \text{\# of scan flip-flops in circuit}$$

$SCC_i$=size of i th strongly-connected component (SCC) in the circuit graph nDFTcand=# of test points+# of scanned flip-flop candidates returned by the linear program DFT=# of test points+# of scanned flip-flops Objective Function:

$$\text{Maximize}\left(T - k \times DFT - \sum_i N_i\right)$$

Constraints:

1. $0 \leq \sum_{i=1}^{F} Y_i \leq F$

2. $nDFTcand = 5$ if $nSCCs \leq 5$ else $nSCCs$

3. $SCC[nSCCs, F] \times Y[F] \geq 1$

Constraint 1 just says that one can scan only as many flip-flops as exist in the circuit. Constraint 2 forces the linear program to return at least five candidates for TPs or SFFs, and if there are more than 5 SCCs, the number of candidates returned is the number of SCCs. Although this choice of 5 is arbitrary, it gives good results. In this version of the method, we insert complete test points (CTPs), which provide 0-controllability, 1-controllability, and observability. In practice, the algorithm and linear program can be improved to insert only 0-controllability, 1-controllability, or observability TPs, rather than CTPs, depending on what is needed at the site of the DFT hardware. Constraint 3 forces at least one flip-flop to be scanned in each SCC, in order to break the cycle. The LP may scan additional flip-flops in the SCC, if this reduces the entropy. The algorithm will automatically choose the places in the circuit with lowest entropy to scan or to insert TPs, because the objective function is to maximize the entropy. The linear program will replace the entropy of every proposed DFT hardware site with 1.0, the maximum entropy, because either a test point or a scan flip-flop will restore the DFT hardware site to maximum information flow. The LP considers all possible DFT sites, and picks the one that will boost the system entropy the most. As partial-scan or full-scan flip-flops are added, the number of SCCs will reduce because scanning a flip-flop in an SCC may disconnect the graph clique. The LP will stop when the gain from improving the entropy at a DFT site is less than the penalty of the additional DFT hardware. As an example, consider a DFT site with entropy of 0.12. The algorithm puts a TP or a SFF at that site, so its entropy rises to 1.0, but the variable DFT increases by 1.0. Assuming that k=0.95, the net change to the cost function is +0.88−0.95×1=−0.07, so this will not increase the objective function, and this site will not be considered. If k=0.99, then the net change becomes −0.11. Now, consider a DFT site where the entropy is 0.04, so the net change to the cost function by scanning that site is 0.96−0.95×1=0.01, so that site will be considered for DFT hardware. Eventually, the LP will be unable to further increase the objective function, because the entropy of all sites in the circuit has risen, so the LP will terminate.

TABLE 5

Characteristics of 1989 ISCAS benchmark circuits.

| Circuit | PIs | FFs |
|---|---|---|
| s298 | 3 | 14 |
| s344 | 9 | 15 |
| s349 | 9 | 15 |
| s382 | 3 | 21 |
| s386 | 7 | 6 |
| s400 | 4 | 21 |
| s444 | 3 | 21 |
| s526 | 3 | 21 |
| s641 | 35 | 19 |
| s713 | 35 | 21 |
| s820 | 18 | 5 |
| s953 | 16 | 29 |
| s1423 | 17 | 74 |
| s1488 | 8 | 6 |
| s1494 | 8 | 6 |
| s5378 | 35 | 179 |
| s9234 | 19 | 228 |
| s13207 | 31 | 669 |
| s15850 | 77 | 534 |
| s35932 | 35 | 1728 |
| s38417 | 28 | 1636 |
| s38584 | 12 | 1452 |

TABLE 6

Full-scan fault coverage, test vector count, and test point count.

| | LP + ENTROPY | | | SPARTAN | | | | | | | | | TRAN | |
|---|---|---|---|---|---|---|---|---|---|---|---|---|---|---|
| | Full Scan | | | PS Only | | PS + TP1 | | | PS + TP2 | | | Full-Scan | | |
| Ckt. | TP | FC | V | SFF | FC | V | TP | FC | V | TP | FC | V | FC | V |
| s298 | 0 | 100 | 28 | 11 | 99.67 | 37 | 5 | 99.68 | 36 | 4 | 99.68 | 41 | 100 | 55 |
| s344 | 6 | 100 | 15 | 7 | 99.71 | 65 | 1 | 99.71 | 63 | 3 | 99.71 | 50 | 100 | 36 |
| s349 | 7 | 99.45 | 15 | 8 | 99.14 | 50 | 27 | 99.75 | 22 | 4 | 99.16 | 33 | 99.43 | 36 |
| s382 | 2 | 100 | 30 | 17 | 99 | 215 | 1 | 99 | 164 | 16 | 99.54 | 93 | 100 | 54 |
| s386 | 6 | 100 | 68 | 4 | 99.48 | 119 | 25 | 100 | 89 | 10 | 100 | 94 | 100 | 100 |
| s400 | 3 | 99.1 | 30 | 16 | 94.6 | 236 | 1 | 94.63 | 252 | 16 | 95.42 | 79 | 98.59 | 52 |
| s444 | 2 | 97.91 | 28 | 18 | 96.84 | 158 | 1 | 95.38 | 116 | 19 | 98.05 | 91 | 97.05 | 49 |
| s526 | 3 | 99.82 | 52 | 19 | 99.64 | 131 | 1 | 99.82 | 112 | 3 | 99.82 | 105 | 99.82 | 116 |
| s641 | 9 | 100 | 22 | 9 | 99.14 | 107 | 40 | 99.64 | 108 | 6 | 99.58 | 115 | 100 | 101 |
| s713 | 5 | 94.12 | 28 | 9 | 92.94 | 125 | 39 | 95.14 | 105 | 6 | 93.09 | 130 | 93.46 | 102 |
| s820 | 1 | 100 | 114 | 2 | 99.69 | 349 | 187 | 100 | 93 | 48 | 100 | 171 | 100 | 196 |
| s953 | 21 | 100 | 79 | 23 | 100 | 98 | 3 | 100 | 90 | 3 | 100 | 90 | 100 | 132 |
| s1423 | 0 | 99.01 | 39 | 63 | 98.75 | 131 | 19 | 98.78 | 68 | 3 | 98.75 | 95 | 99.08 | 130 |
| s1488 | 5 | 100 | 119 | 5 | 100 | 136 | 389 | 100 | 56 | 58 | 100 | 131 | 100 | 214 |
| s1494 | 5 | 99.21 | 114 | 4 | 99.2 | 179 | 399 | 100 | 66 | 26 | 99.42 | 191 | 99.2 | 213 |
| s5378 | 30 | 99.14 | 160 | 114 | 98.81 | 535 | 2 | 98.87 | 556 | 44 | 98.78 | 517 | 99.13 | 432 |
| s9234 | 19 | 92.19 | 232 | 199 | 93.32 | 958 | 7 | 93.27 | 717 | 102 | 94.81 | 860 | 93.47 | 666 |
| s13207 | 24 | 97.31 | 314 | 496 | 97.77 | 879 | 21 | 98.02 | 875 | 20 | 97.82 | 1044 | 98.46 | 744 |
| s15850 | 8 | 95.09 | 233 | 407 | 93.08 | 3906 | 30 | 92.74 | 661 | 7 | 93.33 | 832 | 96.68 | 722 |
| s38417 | 25 | 98.95 | 598 | 1249 | 98.44 | 3113 | 27 | 98.48 | 3066 | 201 | 98.82 | 3433 | 99.47 | 1601 |
| s38584 | 27 | 96.34 | 366 | 924 | 94.54 | 1491 | 24 | 94.38 | 1460 | 87 | 94.25 | 1449 | 95.85 | 1240 |
| s35932 | 0 | 89.81 | 38 | 477 | 89.8 | 261 | 27 | 89.92 | 166 | 18 | 89.83 | 150 | 89.81 | 79 |
| Ave. | 9.45 | 98.07 | 123.73 | 185.5 | 97.43 | 604 | 58 | 97.60 | 406 | 32 | 97.72 | 445 | 98.16 | 321 |

TABLE 7

Full-scan test volume and test application time.

| | LP + ENTROPY | | SPARTAN | | | | | | TRAN | |
|---|---|---|---|---|---|---|---|---|---|---|
| | Full-Scan | | PS Only | | PS + TP1 | | PS + TP2 | | Full-Scan | |
| Ckt. | TV | TAT | TV | TAT | TV | TAT | TV | TAT | TV | TAT |
| s298 | 504 | 452 | 555 | 470 | 720 | 648 | 779 | 690 | 990 | 857 |
| s344 | 465 | 376 | 1105 | 538 | 1134 | 587 | 1000 | 574 | 900 | 610 |
| s349 | 480 | 393 | 900 | 470 | 990 | 866 | 726 | 457 | 900 | 610 |
| s382 | 810 | 770 | 4515 | 3908 | 3608 | 3156 | 3441 | 3232 | 1350 | 1234 |
| s386 | 1360 | 912 | 1428 | 607 | 3293 | 2732 | 2068 | 1442 | 1400 | 716 |
| s400 | 870 | 802 | 4956 | 4048 | 5544 | 4574 | 2923 | 2675 | 1352 | 1190 |
| s444 | 756 | 722 | 3476 | 3042 | 2668 | 2362 | 731 | 3536 | 1225 | 1124 |
| s526 | 1456 | 1352 | 3013 | 2662 | 2688 | 2396 | 2730 | 2463 | 2900 | 2598 |
| s641 | 1408 | 698 | 4815 | 1092 | 9180 | 5502 | 5865 | 1874 | 5555 | 2062 |
| s713 | 1736 | 812 | 5625 | 1272 | 8820 | 5245 | 6630 | 2114 | 5814 | 2290 |
| s820 | 2850 | 814 | 7329 | 1055 | 19344 | 18052 | 11799 | 8825 | 4704 | 1190 |
| s953 | 5293 | 4133 | 3920 | 2402 | 3870 | 2486 | 3870 | 2486 | 6072 | 4022 |
| s1423 | 3588 | 3077 | 10611 | 8514 | 6800 | 5812 | 7980 | 6501 | 11960 | 9902 |
| s1488 | 2380 | 1454 | 1904 | 830 | 22568 | 22912 | 9432 | 8514 | 3210 | 1514 |
| s1494 | 2280 | 1394 | 2327 | 907 | 27192 | 27474 | 7449 | 5985 | 3195 | 1507 |
| s5378 | 39200 | 34022 | 80250 | 61757 | 84512 | 65288 | 100298 | 82523 | 92880 | 78122 |
| s9234 | 61944 | 58034 | 209802 | 192002 | 162042 | 148835 | 276060 | 260326 | 165168 | 152974 |
| s13207 | 227650 | 219306 | 464112 | 437859 | 480375 | 454288 | 572112 | 540784 | 521544 | 499822 |
| s15850 | 144460 | 127607 | 1894410 | 1594466 | 340415 | 290396 | 409344 | 346112 | 441864 | 387342 |
| s38417 | 1010620 | 997202 | 3978414 | 3893752 | 4001130 | 3917838 | 5077467 | 4984187 | 2665665 | 2624113 |
| s38584 | 546072 | 544642 | 1397067 | 1381027 | 1403060 | 1387440 | 1483776 | 1468414 | 1816600 | 1804628 |
| s35932 | 67032 | 69162 | 133893 | 125716 | 89640 | 84842 | 79650 | 75394 | 139356 | 140051 |
| Ave. | 96510 | 94006 | 373383 | 350836 | 303618 | 293351 | 366640 | 354960 | 267937 | 259931 |

TABLE 8

Summary comparisons of full-scan LP + Entropy algorithm vs. SPARTAN + TP1, SPARTAN + TP2, and full-scan.

| | |
|---|---|
| Test Volume Reduction over SPARTAN TP1 algorithm (%) = | 68.213% |
| Test Volume Reduction over SPARTAN TP2 algorithm (%) = | 73.677% |
| Test Volume Reduction over TRAN algorithm (%) = | 63.980% |
| TAT Reduction over SPARTAN TP1 algorithm (%) = | 67.954% |
| TAT Reduction over SPARTAN TP2 algorithm (%) = | 73.516% |

TABLE 8-continued

Summary comparisons of full-scan LP + Entropy algorithm vs. SPARTAN + TP1, SPARTAN + TP2, and full-scan.

| | |
|---|---|
| TAT Reduction over TRAN algorithm (%) = | 63.834% |
| Fault Coverage Increase over SPARTAN TP1 algorithm (%) = | 0.470% |
| Fault Coverage Increase over SPARTAN TP2 algorithm (%) = | 0.350% |
| Fault Coverage Increase over TRAN algorithm (%) = | −0.090% |

TABLE 9

Partial-scan scanned flip-flop count, test point count, fault coverage, and test vector count.

| | LP + Entropy | | | | SPARTAN | | | | | | | | | TRAN | |
|---|---|---|---|---|---|---|---|---|---|---|---|---|---|---|---|
| | Partial-Scan | | | | | PS Only | | PS + TP1 | | | PS + TP2 | | | Full-Scan | |
| Ckt. | SFF | TP | FC | V | SFF | FC | V | TP | FC | V | TP | FC | V | FC | V |
| s298 | 7 | 0 | 99.35 | 39 | 11 | 99.67 | 37 | 5 | 99.68 | 36 | 4 | 99.68 | 41 | 100 | 55 |
| s344 | 5 | 10 | 99.45 | 43 | 7 | 99.71 | 65 | 1 | 99.71 | 63 | 3 | 99.71 | 50 | 100 | 36 |
| s349 | 5 | 10 | 98.92 | 33 | 8 | 99.14 | 50 | 27 | 99.75 | 22 | 4 | 99.16 | 33 | 99.43 | 36 |
| s382 | 10 | 9 | 99.52 | 54 | 17 | 99 | 215 | 1 | 99 | 164 | 16 | 99.54 | 93 | 100 | 54 |
| s386 | 6 | 8 | 100 | 63 | 4 | 99.48 | 119 | 25 | 100 | 89 | 10 | 100 | 94 | 100 | 100 |
| s400 | 10 | 7 | 99.1 | 35 | 16 | 94.6 | 236 | 1 | 94.63 | 252 | 16 | 95.42 | 79 | 98.59 | 52 |
| s444 | 11 | 10 | 99.19 | 44 | 18 | 96.84 | 158 | 1 | 95.38 | 116 | 19 | 98.05 | 91 | 97.05 | 49 |
| s526 | 12 | 4 | 99.28 | 67 | 19 | 99.64 | 131 | 1 | 99.82 | 112 | 3 | 99.82 | 105 | 99.82 | 116 |
| s641 | 14 | 17 | 100 | 25 | 9 | 99.14 | 107 | 40 | 99.64 | 108 | 6 | 99.58 | 115 | 100 | 101 |
| s713 | 11 | 11 | 94.36 | 52 | 9 | 92.94 | 125 | 39 | 95.14 | 105 | 6 | 93.09 | 130 | 93.46 | 102 |
| s820 | 5 | 1 | 100 | 112 | 2 | 99.69 | 349 | 187 | 100 | 93 | 48 | 100 | 171 | 100 | 196 |
| s953 | 5 | 18 | 100 | 146 | 23 | 100 | 98 | 3 | 100 | 90 | 3 | 100 | 90 | 100 | 132 |
| s1423 | 41 | 5 | 97.97 | 111 | 63 | 98.75 | 131 | 19 | 98.78 | 68 | 3 | 98.75 | 95 | 99.08 | 130 |
| s1488 | 5 | 5 | 100 | 124 | 5 | 100 | 136 | 389 | 100 | 56 | 58 | 100 | 131 | 100 | 214 |
| s1494 | 6 | 9 | 99.21 | 110 | 4 | 99.2 | 179 | 399 | 100 | 66 | 26 | 99.42 | 191 | 99.2 | 213 |
| s5378 | 63 | 61 | 99.01 | 485 | 114 | 98.81 | 535 | 2 | 98.87 | 556 | 44 | 98.78 | 517 | 99.13 | 432 |
| s9234 | 124 | 148 | 98.08 | 427 | 199 | 93.32 | 958 | 7 | 93.27 | 717 | 102 | 94.81 | 860 | 93.47 | 666 |
| s13207 | 196 | 179 | 90.54 | 1478 | 496 | 97.77 | 879 | 21 | 98.02 | 875 | 20 | 97.82 | 1044 | 98.46 | 744 |
| s15850 | 198 | 113 | 94.65 | 1585 | 407 | 93.08 | 3906 | 30 | 92.74 | 661 | 7 | 93.33 | 832 | 96.68 | 722 |

TABLE 9-continued

Partial-scan scanned flip-flop count, test point count, fault coverage, and test vector count.

| | LP + Entropy | | | | SPARTAN | | | | | | | | | TRAN | |
|---|---|---|---|---|---|---|---|---|---|---|---|---|---|---|---|
| | Partial-Scan | | | | PS Only | | | PS + TP1 | | | PS + TP2 | | | Full-Scan | |
| Ckt. | SFF | TP | FC | V | SFF | FC | V | TP | FC | V | TP | FC | V | FC | V |
| s35932 | 565 | 0 | 89.76 | 218 | 477 | 89.8 | 261 | 27 | 89.92 | 166 | 18 | 89.83 | 150 | 89.81 | 79 |
| s38417 | 499 | 331 | 97.48 | 2694 | 1249 | 98.44 | 3113 | 27 | 98.48 | 3066 | 201 | 98.82 | 3433 | 99.47 | 1601 |
| s38584 | 372 | 155 | 94.83 | 2729 | 924 | 94.54 | 1491 | 24 | 94.38 | 1460 | 87 | 94.25 | 1449 | 95.85 | 1240 |
| Ave. | 98.6 | 50.5 | 97.76 | 485.2 | 185.5 | 97.43 | 603.6 | 58 | 97.60 | 406.4 | 32 | 97.72 | 445.2 | 98.16 | 321.4 |

2.1 Algorithm
1. Calculate the number of logic gates L, the number of flip-flops F, and the strongly-connected components (SCCs) in the circuit graph. (Block 500) However, we do not count self-loops in the SCC count. Level number the logic gates from PIs to POs.
2. Perform a scan flush test simulation by stimulating all scan chains with enough vectors to initialize them, so that there are no X's in the flip-flops. (Block 505) The algorithm needs to be extended to provide for pipelined memory, to make sure that the memory fills up during scan flush with data, so that no X's can reach subsequent combinational circuits after this step.
3. Use $3.125 \times 2^{number\ of\ primary\ inputs}$ input random vectors, up to a maximum of 100,000 vectors, to simulate the circuit. (Block 510) Note the percent of the time that each signal is logic 1.
4. Compute signal probabilities from the simulation results for each circuit line.
5. Calculate the entropy of each circuit line, using Equation 1.
6. While the linear program returns nSCC or more DFT candidates (Block 515) (given by the variable nDFT-cand):
   a. The LP returns nDFTcand candidates, and we pick the one with the lowest entropy, and insert a scanned flip-flop or a test point there. (Block 520)
   b. Logic simulate 512 or $2^{number\ of\ primary\ inputs}$ random vectors, whichever is smaller. Update the signal probabilities in the entire circuit, recalculate entropies, and recalculate nSCCs, the number of SCCs in the circuit, which may have changed if the last inserted DFT hardware was an SFF. (Block 525)
   c. Rerun the linear program to select where to put the next scanned flip-flop or test point. (Block 530)

Eventually, the linear program will be unable to increase the entropy, by inserting more DFT hardware, so it will return less than nSCC candidates, which causes this algorithm to stop. The linear program is formulated to force the breaking of all cycles in the circuit involving flip-flops. However, self-loops from a flip-flop, through combinational logic, and back to the same flip-flop, are not broken. FIG. 14 shows the algorithm's flow chart.

2.2 Computational Complexity

The LP is an O (L+F) algorithm, and will always return an optimal solution. Also, since the LP and the algorithm always acts to increase entropy by the maximum amount possible by any DFT decision, the total entropy in the circuit is monotonically increasing, so the algorithm will never have to undo prior DFT hardware insertion. It will find the optimal order in which to insert DFT hardware. The complexity of Step 1 is O (L+F), and that of Step 2 is O (L+F)×number of vectors. Steps 3 and 4 are also O (L+F). Step 5(*a*) is of O (L+F) complexity, as is Step 5(*b*). So, the total complexity is given by the number of times the while loop iterates, which is up to some fraction of L+F. So, the while loop has complexity $O\ (L+F)^2$, as does the entire algorithm.

2.3 Extensions

Several extensions were applied to this method, to improve it further. A weight, $N_l$ was added to each circuit line, supplied by the designer, which removed a line from consideration for test hardware when it was ≧1. The greater the number, the less likely the DFT algorithm is to insert DFT hardware on that line. This drives the DFT hardware off critical paths, and forces the linear program to position DFT hardware on non-critical delay paths.

This method was also combined with Khan et al.'s method (see above), which analyzed the spectral response of the flip-flops in the CUT. One may compute the spectral coefficients and calculate the average spectral coefficients of the circuit lines. This testability measure may be used in conjunction with the entropy to make test point insertion and scan flip-flop decisions.

2.4 Results

Experiments were run using the linear program on all of the ISCAS '89 benchmarks (see F. Brglez, D. Bryan, and K. Kozminski, "Combinational Profiles of Sequential Benchmark Circuits," Proc. of the Int'l. Symp. on Circuits and Systems, pp 1929-1934, May, 1989), with the exception of s208 and s510. A C language program implemented the algorithm discussed above, and generated the constraints for the linear program. Note that this method requires the updating of the circuit entropy measures after each DFT element is inserted, to avoid excessive addition of testability hardware. Table 5 shows the characteristics of the ISCAS '89 benchmarks, including their numbers of PIs and flip-flops (FFs). The k parameter was set to 0.95 for full-scan circuits, and 0.99 for partial-scan circuits (to more heavily penalize the use of additional scan flip-flops).

The linear programming algorithm was run using the AMPL linear programming tool on an IBM PC, but the accompanying C program ran on a Sun workstation. After DFT hardware was inserted, the GATEST ATPG algorithm, as described in E. M. Rudnick, J. H. Patel, G. S. Greenstein, and T. M. Niermann, "A Genetic Algorithm Framework for Test Generation," IEEE Trans. on CAD, 16(9): 1034-1044, September, 1997, generated test patterns for the circuit. GATEST is not the most effective ATPG algorithm on hard-to-test circuits, but after DFT hardware insertion, the circuits become so much easier to test that GATEST works more effectively than other ATPG methods.

2.4.1 Full-Scan Results

The full-scan experimental conditions were analogous to those for the partial-scan experiments, except that before the linear program ran, all flip-flops were scanned, and the variables and constraints pertaining to scan flip-flops were deleted from the linear program. Table 6 shows the count of test points (TPs) inserted by the linear program, and compares it with the prior work, SPARTAN. We also compare results with a full-scan design, whose patterns are generated by NEC's ATPG program TRAN, as described in S. T. Chakradhar, V. D. Agrawal and S. G. Rothweiler, "A Transitive Closure Algorithm for Test Generation," IEEE Trans. on CAD, 12(7): 1015-1028, July, 1993. The SFF count listed under SPARTAN: PS Only is the same as the SFF count resulting from SPARTAN: PS+TP1 and SPARTAN: PS+TP2. The latter two algorithms are allowed to insert test points, as well as SFFs, but they differ from each other. The SPARTAN: PS Only algorithm is only allowed to insert SFFs. Table 6 also shows the test vector counts (Vs) and FCs achieved by the ATPG program after each DFT algorithm has modified the circuit. Table 7 shows the full-scan TV and TAT values for the linear programming method, which are computed in the same way as the authors of SPARTAN compute them. These values are derived from the values in Table 6.

Table 8 summarizes the comparisons of the various DFT methods. In every way, the linear program achieves dramatically better results than the other methods for TV and TAT, which are most closely related to the economic costs of test. Reducing TV reduces the size of the expensive memory needed in the automatic test equipment (ATE). Reducing TAT directly reduces the cost of test. The fault coverage of the linear programming method is better than that achieved by SPARTAN, but 0.090% worse than the coverage achieved by full-scan with TRAN. Again, this is a minor discrepancy, and can be eliminated with more attention to the ATPG system used with the linear program DFT inserter.

2.4.2 Partial-Scan Results

Table 9 shows the fault coverages, test vector counts, and numbers of test points (TPs) for the various methods being compared, as well as the count of partial-scan flip-flops (SFFs) inserted by the LP. Table 10 shows the TV and TAT results for the various partial and full-scan methods being compared.

TABLE 11

Summary comparisons of partial-scan LP + Entropy algorithm vs. SPARTAN + TP1, SPARTAN + TP2, and full-scan.

| | |
|---|---|
| Test Volume Reduction over SPARTAN TP1 algorithm (%) = | 19.560% |
| Test Volume Reduction over SPARTAN TP2 algorithm (%) = | 33.415% |
| Test Volume Reduction over Full-Scan algorithm (%) = | 8.852% |

TABLE 10

Partial-scan test volume and test application time.

| Ckt. | LP + Entropy Partial-Scan TV | LP + Entropy Partial-Scan TAT | SPARTAN PS Only TV | SPARTAN PS Only TAT | SPARTAN PS + TP1 TV | SPARTAN PS + TP1 TAT | SPARTAN PS + TP2 TV | SPARTAN PS + TP2 TAT | TRAN Full-Scan TV | TRAN Full-Scan TAT |
|---|---|---|---|---|---|---|---|---|---|---|
| s298 | 429 | 330 | 555 | 470 | 720 | 648 | 779 | 690 | 990 | 857 |
| s344 | 1075 | 722 | 1105 | 538 | 1134 | 587 | 1000 | 574 | 900 | 610 |
| s349 | 825 | 562 | 900 | 470 | 990 | 866 | 726 | 457 | 900 | 610 |
| s382 | 1242 | 1122 | 4515 | 3908 | 3608 | 3156 | 3441 | 3232 | 1350 | 1234 |
| s386 | 1386 | 977 | 1428 | 607 | 3293 | 2732 | 2068 | 1442 | 1400 | 716 |
| s400 | 770 | 668 | 4956 | 4048 | 5544 | 45749 | 2923 | 2675 | 1352 | 1190 |
| s444 | 1100 | 1014 | 3476 | 3042 | 2668 | 2362 | 3731 | 3536 | 1225 | 1124 |
| s526 | 1340 | 1175 | 3013 | 2662 | 2688 | 2396 | 2730 | 2463 | 2900 | 2598 |
| s641 | 1675 | 866 | 4815 | 1092 | 9180 | 5502 | 5865 | 1874 | 5555 | 2062 |
| s713 | 3016 | 1244 | 5625 | 1272 | 8820 | 5245 | 6630 | 2114 | 5814 | 2290 |
| s820 | 2800 | 800 | 7329 | 1055 | 19344 | 18052 | 11799 | 8825 | 4704 | 1190 |
| s953 | 5840 | 3554 | 3920 | 2402 | 3870 | 2486 | 3870 | 2486 | 6072 | 4022 |
| s1423 | 7104 | 5313 | 10611 | 8514 | 6800 | 5812 | 7980 | 6501 | 11960 | 9902 |
| s1488 | 2356 | 1388 | 1904 | 830 | 22568 | 22912 | 9432 | 8514 | 3210 | 1514 |
| s1494 | 2640 | 1794 | 2327 | 907 | 27192 | 27474 | 7449 | 5985 | 3195 | 1507 |
| s5378 | 77600 | 60877 | 80250 | 61757 | 84512 | 65288 | 100298 | 82523 | 92880 | 78122 |
| s9234 | 124684 | 117119 | 209802 | 192002 | 162042 | 148835 | 276060 | 260326 | 165168 | 152974 |
| s13207 | 601546 | 556482 | 464112 | 437859 | 480375 | 454288 | 572112 | 540784 | 521544 | 499822 |
| s15850 | 616565 | 495146 | 1894410 | 1594466 | 340415 | 290396 | 409344 | 346112 | 441864 | 387342 |
| s35932 | 131018 | 124522 | 133893 | 125716 | 89640 | 84842 | 79650 | 75394 | 139356 | 140051 |
| s38417 | 2314146 | 2240378 | 3978414 | 3893752 | 4001130 | 3917838 | 5077407 | 4984187 | 2665665 | 2624113 |
| s38584 | 1473660 | 1441970 | 1397067 | 1381027 | 1403060 | 1387440 | 1483776 | 1468414 | 1816600 | 1804628 |
| Ave. | 244219 | 229910 | 373383 | 350836 | 303618 | 295223 | 366776 | 354960 | 267937 | 259931 |

$$TV = n_{vectors} \times (n_{PI} + n_{SFF} + n_{TP} + 1)$$

$$TAT = n_{vectors} + 2) \times (n_{SFF} + n_{TP}) + n_{vectors} + 4 \text{ clocks}$$

The number of vectors is $n_{vectors}$, the number of PIs is $n_{PI}$, the number of inserted test points is $n_{TP}$, and the number of scanned flip-flops is $n_{SFF}$. SPARTAN, by Khan and Bushnell (see above), inserts partial-scan flip-flops in one pass, using entropy and spectral analysis of flip-flops in the circuit, and then inserts TPs in a separate pass. Unfortunately, because these decisions are not made jointly, too much DFT hardware is inserted. TRAN is a combinational ATPG program used at NEC for many years. It is used in conjunction with full-scan design, but with no test points. We put its results in for comparison purposes.

TABLE 11-continued

Summary comparisons of partial-scan LP + Entropy algorithm vs. SPARTAN + TP1, SPARTAN + TP2, and full-scan.

| | |
|---|---|
| TAT Reduction over SPARTAN TP1 algorithm (%) = | 22.123% |
| TAT Reduction over SPARTAN TP2 algorithm (%) = | 35.229% |
| TAT Reduction over Full-Scan algorithm (%) = | 11.550% |
| Fault Coverage Increase over SPARTAN TP1 algorithm (%) = | 0.330% |
| Fault Coverage Increase over SPARTAN TP2 algorithm (%) = | 0.040% |
| Fault Coverage Increase over Full-Scan algorithm (%) = | −0.400% |

Table 11 summarizes the comparisons between the five DFT methods. One sees that the linear programming method is vastly superior to the other methods. The only area in which the linear program performs slightly less effectively is in the fault coverage achieved by partial-scan, compared to that achieved by full-scan using TRAN as the ATPG method. However, the difference is only 0.4% less fault coverage, which is negligible. This difference can undoubtedly be improved with more attention to the ATPG system used with the linear programming DFT inserter.

2.4.3 Validation

The fault coverages and test lengths in these results were validated by running the generated test patterns and the modified circuit netlist through the HOPE fault simulator, from Virginia Tech., as described in Lee, H. K. and Ha, D. S., "HOPE: An Efficient Parallel Fault Simulator," Proc. of the 29th Design Automation Conf., pp 336-340, 1992.

3. Spectral and Entropy DFT Inserter with Statistical Unbiasing

Jain and Agrawal used probability estimation from logic simulation to estimate fault coverages in digital circuits, as described in S. K. Jain and V. D. Agrawal, "STAFAN: An Alternative to Fault Simulation," Proc. of the Design Automation Conf., pp 18-23, 1984. They found it necessary to unbias the probability estimates, which is also necessary in the present invention. The probabilities computed from simulating N vectors are statistical estimates, and are random variables whose values converge to exact values as N approaches infinity. Assume that p(x) is the probability density function of a signal probability in the circuit, and that the mean, $x_0$, of this random variable is the exact value of the detection probability. The exact probability distribution function is unknown, so we assume that x is uniformly distributed in the domain $[x_0-\Delta, x_0+\Delta]$. The estimated signal probability is x. The signal entropy is given by the random variable E:

$$E = -x \log_2 x - (1-x) \log_2 (1-x)$$

In order to calculate the actual probability, we compute the expected value of the mean, X(N), from the N samples. To find the real entropy, we compute the expected value:

$$E(E) = \frac{1}{2\Delta} \int_{x_0-\Delta}^{x_0+\Delta} (-x \log_2 x - (1-x) \log_2 (1-x)) dx$$

$$= \frac{1}{2\Delta \ln 2} \int_{x_0-\Delta}^{x_0+\Delta} (-x \ln x - (1-x) \ln(1-x)) dx$$

This expression shows that the mean value of our entropy estimation is biased from the required value, due to the presence of $\Delta$ in the integration limits due to our assumptions about the unknown distribution of random variable x. If the detection probability was determined through N Bernoulli trials, as described in K. S. Trivedi, Probability and Statistics with Reliability, Queueing, and Computer Science Applications, Prentice-Hall, 1982, Englewood Cliffs, N.J., pp 495-496, then its standard deviation would be $$\frac{-x_0 \log_2 x_0 - (1-x_0) \log_2 (1-x_0)}{\sqrt{N}}$$

Let $\beta$ be a proportionality constant to account for the determining process not being Bernoulli trials and for the assumed uniform density function for x. So, we have an unbiasing factor $W(x_0) = f(\beta)$, where the function $f$ is determined from the above integral. Finally, since the true mean $x_0$ is not known, we substitute the sample mean X(N) in its place to get:

$$X(N) \cong \frac{-x \log_2(x) - (1-x) \log_2(1-x)}{W(x)}$$

leaving the value of $\beta$ to be determined empirically from experiments on a small sample of large circuits.

More advanced experiments were conducted on the Linear Programming DFT algorithm, which performs better than the SPARTAN algorithm. We used the ITC 1999 circuits, summarized in Table 12, which are more difficult than ISCAS '89 circuits. Table 13 shows a comparison of inserting DFT hardware using the probability of a signal being 1 versus using the Entropy measures. In the Entropy method and one of the probability methods, we also statistically unbias the p (1) measures used to calculate probabilities and entropy. The limited logic simulation in this tool of a sample of random vectors has a statistical sampling problem: the vector sample may create a biased estimate of the signal probability. It is customary in statistics to unbias such samples. TE refers to test efficiency (or fault efficiency), V refers to the number of test vectors, and TMAX CPU Time refers to the Tetramax CPU time. Tetramax is regarded as the best available commercial automatic test pattern generator. Table 14 shows a summary of this experiment. Table 14 summarizes the results of Table 13, with the best results highlighted in bold. It is obvious that entropy with statistical unbiasing is superior to probability, either with or without unbiasing, in every way. TAT refers to test application time and TV refers to test data volume. These are the key economic parameters that measure actual test cost. Using p (1) as a testability measure means that test points will be inserted at circuit points needing more logic 0 controllability, but not at circuit points needing more logic 1 controllability, so that is why entropy performs better than p (1) as a testability measure. Note that the significant reduction in Tetramax CPU time is also of great importance, as test vector computation time is a severe problem for the Integrated Circuit industry. In all experiments, the best results in each table are shown in bold. Also, TP is the limit on the number of inserted test points, which is set for each circuit so that the TP hardware overhead is <10%.

Table 15 shows a comparison of the original Linear Programming algorithm with the same algorithm recoded using Gradient Descent optimization. FIG. 15 shows the flow of the Gradient Descent optimization. TE refers to test efficiency and V refers to the number of vectors. The best results are summarized in bold. This experiment explores the effect of the optimization algorithm and the number of random vectors simulated on the results. All results are compared with the original Tetramax run results (without any testability hardware inserted) in Table 13. The columns without any primes refer to the Linear Programming algorithm with statistical unbiasing of entropy, and with a minimal number of random vectors simulated. The columns with prime denote the same experiment, but with no statistical unbiasing and Linear Programming replaced with a Gradient Descent algorithm. The columns with double prime denote the same experiment as the prime columns, but with the number of random vectors during simulation greatly increased. Finally, the columns denoted with Q" (double prime) are the same experiment as the double prime columns, but with statistical unbiasing added. Note that the Gradient Descent algorithm in Q" is superior, mainly because of increased random vector lengths during simulation and better statistical unbiasing. However, note that the original Linear Programming algorithm still gets the very best Test Efficiency of 100% on the largest circuits.

Next, an experiment was performed using a different testability measure, called Entropy Gain, in which the test point is inserted at the place in the circuit where it will cause the biggest gain in the sum of entropy at the test point site, and at all of its immediate fanouts. Table 16 shows the results of this experiment. This Entropy Gain method obtains the very highest test efficiency (TE) of all of the entropy experiments, but it does so at the expense of much longer TAT and larger TV. Therefore, we conclude that Entropy Gain yields the highest TE, while Entropy gives the shortest TAT.

The final experiment uses both spectral and entropy analysis simultaneously. The entropy measures indicate where the circuit controllability is poor, while the spectral analysis indicates where observability of the test point site at POs is poor, or where controllability of the test point site from PIs is poor. Table 17 shows these results. Here we compare the best prior results using only entropy measures (the Q" columns) with a method combining entropy and spectral analysis. The spectral analysis is first done with overlapping 32-bit vector streams that are analyzed for their spectral coefficients. Then, the spectral analysis is repeated using 32-bit chunks without overlap, which runs 32 times faster. The entropy-only approach gets the shortest vector length, but the spectral approach with overlap gets the highest test efficiency (TE) and shortest Tetramax CPU time.

TABLE 12

Characteristics of ITC 1999 circuits.

| Ckt. | PIs | FF | # Gates |
|---|---|---|---|
| b01 | 2.00 | 5.00 | 32.00 |
| b02 | 1.00 | 4.00 | 19.00 |
| b03 | 4.00 | 30.00 | 103.00 |
| b04s | 11.00 | 66.00 | 463.00 |
| b05s | 1.00 | 34.00 | 783.00 |
| b06 | 2.00 | 9.00 | 36.00 |
| b07s | 1.00 | 49.00 | 326.00 |
| b08 | 9.00 | 21.00 | 116.00 |
| b09 | 1.00 | 28.00 | 115.00 |
| b10 | 11.00 | 17.00 | 139.00 |
| AVG | 14.00 | 225.89 | 3525.89 |
| b11s | 7.00 | 31.00 | 388.00 |
| b12 | 5.00 | 121.00 | 817.00 |
| b13s | 10.00 | 53.00 | 236.00 |
| b14s | 32.00 | 245.00 | 4124.00 |
| b15s | 36.00 | 449.00 | 7844.00 |
| b17s | 37.00 | 1415.00 | 21556.00 |
| b20s | 32.00 | 490.00 | 8189.00 |
| b21s | 32.00 | 490.00 | 8544.00 |
| b22s | 32.00 | 735.00 | 13162.00 |

TABLE 13

Raw data comparing entropy vs. probability as a testability measure.

| | Tetramax Run before DFT Hardware Inserted | | | Tetramax Runs after DFT Hardware Inserted | | | | | | | | |
|---|---|---|---|---|---|---|---|---|---|---|---|---|
| Ckt. | TE | V | TMAX CPU TIME (s) | TE Ent. | TE Prob. Biased | TE Prob. Unbiased | V Ent. | V Prob. Biased | V Prob. Unbiased | TMAX CPU TIME Ent. (s) | TMAX CPU TIME (s) Prob. Biased | TMAX CPU TIME (s) Prob. Unbiased |
| b01 | 100.00 | 16.00 | 0.07 | 100.00 | 100.00 | 100.00 | 15.00 | 15.00 | 15.00 | 0.06 | 0.09 | 0.07 |
| b02 | 100.00 | 11.00 | 0.06 | 100.00 | 100.00 | 100.00 | 10.00 | 10.00 | 10.00 | 0.07 | 0.06 | 0.06 |
| b03 | 100.00 | 24.00 | 0.12 | 100.00 | 100.00 | 100.00 | 15.00 | 15.00 | 15.00 | 0.10 | 0.09 | 0.10 |
| b04s | 99.60 | 54.00 | 0.83 | 99.87 | 99.87 | 99.87 | 40.00 | 40.00 | 40.00 | 0.50 | 0.45 | 0.01 |
| b05 | 99.91 | 65.00 | 2.15 | 99.92 | 99.24 | 99.24 | 71.00 | 76.00 | 76.00 | 0.14 | 4.97 | 6.31 |
| b06 | 100.00 | 16.00 | 0.08 | 100.00 | 100.00 | 100.00 | 15.00 | 15.00 | 15.00 | 0.10 | 0.06 | 0.06 |
| b07 | 100.00 | 44.00 | 0.34 | 100.00 | 100.00 | 100.00 | 29.00 | 29.00 | 29.00 | 0.30 | 0.25 | 0.25 |
| b08 | 100.00 | 36.00 | 0.18 | 100.00 | 100.00 | 100.00 | 27.00 | 30.00 | 30.00 | 0.50 | 0.16 | 0.14 |
| b09 | 100.00 | 29.00 | 0.13 | 100.00 | 100.00 | 100.00 | 16.00 | 16.00 | 16.00 | 0.11 | 0.10 | 0.10 |
| b10 | 100.00 | 40.00 | 0.15 | 100.00 | 100.00 | 100.00 | 32.00 | 32.00 | 32.00 | 0.24 | 0.16 | 0.15 |
| b11s | 100.00 | 58.00 | 0.61 | 100.00 | 100.00 | 100.00 | 37.00 | 37.00 | 37.00 | 0.38 | 0.39 | 0.38 |
| b12 | 100.00 | 89.00 | 0.93 | 100.00 | 100.00 | 100.00 | 74.00 | 74.00 | 74.00 | 0.83 | 0.88 | 0.81 |
| b13 | 100.00 | 29.00 | 0.18 | 100.00 | 100.00 | 100.00 | 26.00 | 26.00 | 26.00 | 0.19 | 0.17 | 0.17 |
| b14 | 99.44 | 410.00 | 37.70 | 99.93 | 100.00 | 100.00 | 190.00 | 195.00 | 195.00 | 10.47 | 9.17 | 9.05 |
| b15 | 99.12 | 436.00 | 120.70 | 100.00 | 100.00 | 99.99 | 209.00 | 213.00 | 285.00 | 18.83 | 20.32 | 25.89 |
| b17 | 99.04 | 531.00 | 890.77 | 100.00 | 100.00 | 100.00 | 221.00 | 258.00 | 258.00 | 63.69 | 60.79 | 70.80 |
| b20 | 99.58 | 419.00 | 81.54 | 99.98 | 100.00 | 100.00 | 199.00 | 203.00 | 203.00 | 16.54 | 16.61 | 16.31 |
| b21 | 99.60 | 420.00 | 93.37 | 99.96 | 100.00 | 100.00 | 167.00 | 175.00 | 175.00 | 13.97 | 15.48 | 14.66 |
| b22 | 99.65 | 445.00 | 148.51 | 99.96 | 100.00 | 100.00 | 205.00 | 213.00 | 213.00 | 27.98 | 30.60 | 27.76 |
| Ave | 99.79 | 166.95 | 72.55 | 99.98 | 99.95 | 99.95 | 84.11 | 88.00 | 91.79 | 8.16 | 8.46 | 9.11 |
| Ave. b14-b22 | 99.41 | 443.50 | 228.77 | 99.97 | 100.00 | 100.00 | 198.50 | 209.50 | 221.50 | 25.25 | 25.50 | 27.41 |

TABLE 14

Summary of probability experiment results from Table 13.

|  | Entropy | Probability | |
|---|---|---|---|
|  | Unbiased | Unbiased | Biased |
| TV Reduction (%) overall | 34.93 | 29.59 | 26.88 |
| TAT Reduction (%) overall | 49.47 | 47.09 | 44.69 |
| Vector Length Reduction (%) overall | 49.62 | 47.29 | 45.02 |
| TV Reduction (%) for b14-b22 | 35.49 | 30.09 | 27.34 |
| TAT Reduction (%) for b14-b22 | 54.99 | 52.52 | 49.83 |
| Vector Length Reduction (%) for b14-b22 | 55.24 | 52.76 | 50.06 |
| TMAX CPU Time Reduction (%) overall | 88.76 | 88.33 | 87.44 |
| Fault Coverage Improvement (%) | 1.56 | 1.45 | 1.44 |
| Test Efficiency Improvement (%) | 0.19 | 0.17 | 0.17 |

TABLE 15

Comparison of linear programming vs. gradient descent with varying conditions.

Results from Tetramax after Entropy Tool Is Run

| Ckt | TP | TE | TE' | TE" | FEQ" | V | V' | V" | VQ" | TMAX CPU TIME (s) | TMAX CPU TIME' (s) | TMAX CPU TIME" (s) | TMAX CPU TIME Q" (s) |
|---|---|---|---|---|---|---|---|---|---|---|---|---|---|
| b01 | 1.00 | 100.00 | 100.00 | 100.00 | 100.00 | 15.00 | 16.00 | 16.00 | 15.00 | 0.06 | 0.06 | 0.09 | 0.06 |
| b02 | 1.00 | 100.00 | 100.00 | 100.00 | 100.00 | 10.00 | 11.00 | 11.00 | 10.00 | 0.05 | 0.05 | 0.06 | 0.07 |
| b03 | 3.00 | 100.00 | 100.00 | 100.00 | 100.00 | 15.00 | 20.00 | 20.00 | 15.00 | 0.10 | 0.12 | 0.16 | 0.10 |
| b04 | 19.00 | 99.87 | 99.87 | 99.87 | 99.87 | 44.00 | 45.00 | 45.00 | 40.00 | 0.54 | 0.49 | 0.56 | 0.50 |
| b05 | 21.00 | 95.33 | 100.00 | 99.92 | 99.92 | 73.00 | 72.00 | 73.00 | 71.00 | 29.43 | 2.00 | 2.35 | 0.14 |
| b06 | 2.00 | 100.00 | 100.00 | 100.00 | 100.00 | 16.00 | 16.00 | 16.00 | 15.00 | 0.08 | 0.09 | 0.06 | 0.10 |
| b07 | 13.00 | 100.00 | 100.00 | 100.00 | 100.00 | 30.00 | 38.00 | 34.00 | 29.00 | 0.26 | 0.35 | 0.31 | 0.30 |
| b08 | 5.00 | 100.00 | 100.00 | 100.00 | 100.00 | 27.00 | 34.00 | 35.00 | 27.00 | 0.17 | 0.17 | 0.16 | 0.50 |
| b09 | 6.00 | 100.00 | 100.00 | 100.00 | 100.00 | 18.00 | 17.00 | 21.00 | 16.00 | 0.10 | 0.12 | 0.12 | 0.11 |
| b10 | 5.00 | 100.00 | 100.00 | 100.00 | 100.00 | 36.00 | 35.00 | 38.00 | 32.00 | 0.14 | 0.20 | 0.16 | 0.24 |
| b11 | 12.00 | 100.00 | 100.00 | 100.00 | 100.00 | 37.00 | 57.00 | 52.00 | 37.00 | 0.40 | 0.62 | 0.52 | 0.38 |
| b12 | 34.00 | 100.00 | 100.00 | 100.00 | 100.00 | 73.00 | 84.00 | 85.00 | 74.00 | 0.81 | 0.89 | 0.89 | 0.83 |
| b13 | 12.00 | 100.00 | 100.00 | 100.00 | 100.00 | 26.00 | 30.00 | 28.00 | 26.00 | 0.17 | 0.25 | 0.20 | 0.19 |
| b14 | 123.00 | 100.00 | 99.69 | 99.63 | 99.93 | 200.00 | 303.00 | 346.00 | 190.00 | 10.56 | 38.17 | 38.90 | 10.47 |
| b15 | 231.00 | 100.00 | 100.00 | 100.00 | 100.00 | 197.00 | 362.00 | 415.00 | 209.00 | 19.95 | 35.61 | 36.51 | 18.83 |
| b17 | 659.00 | 100.00 | 100.00 | 99.99 | 100.00 | 252.00 | 387.00 | 361.00 | 221.00 | 60.41 | 111.03 | 99.68 | 63.69 |
| b20 | 245.00 | 100.00 | 100.00 | 100.00 | 99.98 | 230.00 | 230.00 | 230.00 | 199.00 | 20.00 | 20.26 | 24.61 | 16.54 |
| b21 | 252.00 | 100.00 | 99.78 | 99.72 | 99.96 | 212.00 | 313.00 | 365.00 | 167.00 | 19.17 | 61.36 | 69.89 | 13.97 |
| b22 | 385.00 | 100.00 | 99.79 | 99.76 | 99.96 | 220.00 | 353.00 | 416.00 | 205.00 | 29.48 | 121.35 | 117.94 | 27.98 |
| Ave. | 106.79 | 99.75 | 99.95 | 99.94 | 99.98 | 91.11 | 127.53 | 137.21 | 84.11 | 10.10 | 20.69 | 20.69 | 8.16 |
| Ave. b14-b22 | 315.83 | 100.00 | 99.88 | 99.85 | 99.97 | 218.50 | 324.67 | 355.50 | 198.50 | 26.60 | 64.63 | 64.59 | 25.25 |

TABLE 16

Summary of entropy gain experiments.

|  | Entropy with Unbiasing (Q") | Entropy Gain with Unbiasing | Entropy Gain No Unbiasing |
|---|---|---|---|
| TV Reduction (%) overall | 34.93 | 11.88 | 21.64 |
| TAT Reduction (%) overall | 49.47 | 31.68 | 39.47 |
| Vector Length Reduction (%) overall | 49.62 | 32.09 | 39.56 |
| TV Reduction (%) for b14-b22 | 35.49 | 12.30 | 21.91 |
| TAT Reduction (%) for b14-b22 | 54.99 | 36.59 | 43.77 |
| Vector Length Reduction (%) for b14-b22 | 55.24 | 36.75 | 43.97 |
| TMAX CPU Time Reduction (%) overall | 88.76 | 88.07 | 86.84 |
| Fault Coverage Improvement (%) | 1.56 | 1.10 | 1.29 |
| Fault Efficiency Improvement (%) | 0.19 | 0.20 | 0.19 |

TABLE 17

Comparison of entropy vs. entropy with spectral analysis.

Results from Tetramax after Entropy Tool Is Run

| Ckt | TP | TE Q" ENT. | TE ENT. + SPECTRAL | TE ENT. + SPECTRAL NON-OVER-LAP | V Q" ENT. | V ENT. + SPECTRAL | V ENT. + SPECTRAL NON-OVER-LAP | TMAX CPU TIME Q" ENT. (s) | TMAX CPU TIME ENT. + SPECTRAL (s) | TMAX CPU TIME ENT. + SPECTRAL NON-OVER-LAP (s) |
|---|---|---|---|---|---|---|---|---|---|---|
| b01 | 1.00 | 100.00 | 100.00 | 100.00 | 15.00 | 16.00 | 15.00 | 0.06 | 0.06 | 0.01 |
| b02 | 1.00 | 100.00 | 100.00 | 100.00 | 10.00 | 10.00 | 11.00 | 0.07 | 0.05 | 0.06 |
| b03 | 3.00 | 100.00 | 100.00 | 100.00 | 15.00 | 15.00 | 15.00 | 0.10 | 0.10 | 0.09 |
| b04 | 19.00 | 99.87 | 100.00 | 99.87 | 40.00 | 42.00 | 40.00 | 0.50 | 0.42 | 0.52 |
| b05 | 21.00 | 99.92 | 99.86 | 99.24 | 71.00 | 67.00 | 76.00 | 0.14 | 6.96 | 11.84 |
| b06 | 2.00 | 100.00 | 100.00 | 100.00 | 15.00 | 15.00 | 15.00 | 0.10 | 0.08 | 0.06 |
| b07 | 13.00 | 100.00 | 100.00 | 100.00 | 29.00 | 39.00 | 33.00 | 0.30 | 0.31 | 0.28 |
| b08 | 5.00 | 100.00 | 100.00 | 100.00 | 27.00 | 41.00 | 30.00 | 0.50 | 0.16 | 0.15 |
| b09 | 6.00 | 100.00 | 100.00 | 100.00 | 16.00 | 19.00 | 26.00 | 0.11 | 0.11 | 0.12 |
| b10 | 5.00 | 100.00 | 100.00 | 100.00 | 32.00 | 39.00 | 38.00 | 0.24 | 0.16 | 0.15 |
| b11 | 12.00 | 100.00 | 100.00 | 100.00 | 37.00 | 50.00 | 34.00 | 0.38 | 0.48 | 0.40 |
| b12 | 34.00 | 100.00 | 100.00 | 100.00 | 74.00 | 75.00 | 74.00 | 0.83 | 0.88 | 0.87 |
| b13 | 12.00 | 100.00 | 100.00 | 100.00 | 26.00 | 29.00 | 22.00 | 0.19 | 0.21 | 0.17 |
| b14 | 123.00 | 99.93 | 100.00 | 100.00 | 190.00 | 252.00 | 203.00 | 10.47 | 11.43 | 9.95 |
| b15 | 231.00 | 100.00 | 100.00 | 100.00 | 209.00 | 195.00 | 229.00 | 18.83 | 15.86 | 20.85 |
| Ave | 32.53 | 99.98 | 99.99 | 99.94 | 53.73 | 60.27 | 57.40 | 2.19 | 2.48 | 3.03 |

CONCLUSIONS

This work has provided these original contributions:

We proposed new partial-scan, full-scan, and test point insertion algorithms that are the first algorithms that use both spectral and entropy analysis to select scan flip-flops and test points. Difficult-to-control flip-flops have an adverse effect on the testability of the circuit. The first idea here is to scan flip-flops that greatly increase the controllability of unscanned flip-flops. Low toggling flip-flops are difficult to control from PIs. Spectral analysis helps the algorithm to find flip-flops that have low activity. From the results shown in Table 3, we can safely deduce that spectral analysis gives us information regarding the toggling activity of each flip-flop.

The second contribution involves scanning flip-flops such that information flow through unscanned flip-flops from PIs is improved. In other words increasing information flow (entropy) through the circuit improves circuit testability. If the amount of information passing through a flip-flop is high, then the controllability and observability of the flip-flop are high. The entropy analysis combined with spectral analysis gave us a higher FC and TE than mpscan. The TV and TAT are comparable to mpscan and SPARTAN does better than mpscan on the large benchmarks.

This is the first use of linear programming to select places in a circuit for inserting scan flip-flops and test points. Because a linear program can find the optimal solution to a problem with many millions of variables, this approach scales up to the size of circuits in practical use today.

This is the first use of a combined algorithm to make the tradeoff between inserting a scan flip-flop and inserting a test point. Prior algorithms did these operations in separate passes, with the result that they inserted unnecessary test points and unnecessarily scanned flip-flops.

The first use of entropy measures exclusively for test point and scan flip-flop insertion.

On full-scan circuits, our method provided a dramatic reduction of 64.27% in TV compared with conventional full-scan, and an equally dramatic 64.17% reduction in TAT. On partial-scan circuits, our method provided a substantial reduction of 8.85% in TV compared with conventional full-scan, and an 11.2% reduction in TAT compared with full-scan. Compared with SPARTAN, the best prior work on partial-scan insertion, the method reduced both TV and TAT by more than 20%. The linear programming method achieved roughly the same fault coverages as the earlier methods.

We claim:

1. A method for inserting test points and scan flip flops into a digital circuit comprising:
    setting a test hardware limit;
    calculating a number of logic gates, a number of flip-flops and a number of strongly-connected components in the digital circuit; simulating a scan flush test to initialize all scan flip-flops;
    logic simulating the digital circuit with random input vectors and calculating signal probabilities and signal entropies;
    selecting a test point site with a lowest signal entropy and inserting a test point or scan flip-flop at the test point site in the digital circuit;
    determining if the test hardware limit is reached and stopping if the test hardware limit is reached;
    logic simulating the digital circuit with a number of random input vectors and recalculating signal probabilities and signal entropies and the strongly-connected components; and
    returning to the step selecting a test point site.

2. The method of claim 1 wherein the step logic simulating the digital circuit with random input vectors and calculating signal probabilities and signal entropies further comprises determining statistical unbiasing to account for misinformation.

3. The method of claim 1 wherein the step logic simulating the digital circuit with random input vectors and calculating signal probabilities and signal entropies further comprises calculating entropy gain and/or simple entropy as a testability measure.

4. The method of claim 1 wherein the step logic simulating the digital circuit with random input vectors and calculating signal probabilities and signal entropies further comprises calculating signal probabilities and signal entropies simultaneously.

5. A method for inserting test points into a digital circuit comprising: setting a test hardware limit; calculating a number of logic gates in the digital circuit;
   logic simulating the digital circuit with random input vectors and calculating signal probabilities and signal entropies;
   selecting a test point site with a lowest signal entropy and inserting a test point at the test point site in the digital circuit;
   determining if the test hardware limit is reached and stopping if the test hardware limit is reached;
   logic simulating the digital circuit with a number of random input vectors and recalculating signal probabilities and signal entropies; and
   returning to the step selecting a test point site.

6. The method of claim 5 wherein the step logic simulating the digital circuit with random input vectors and calculating signal probabilities and signal entropies further comprises determining statistical unbiasing to account for misinformation.

7. The method of claim 5 wherein the step logic simulating the digital circuit with random input vectors and calculating signal probabilities and signal entropies further comprises calculating entropy gain and/or simple entropy as a testability measure.

8. The method of claim 5 wherein the step logic simulating the digital circuit with random input vectors and calculating signal probabilities and signal entropies further comprises calculating signal probabilities and signal entropies simultaneously.

* * * * *